United States Patent [19]

Asakawa et al.

[11] Patent Number: 5,384,891
[45] Date of Patent: * Jan. 24, 1995

[54] VECTOR QUANTIZING APPARATUS AND SPEECH ANALYSIS-SYNTHESIS SYSTEM USING THE APPARATUS

[75] Inventors: Yoshiaki Asakawa, Kawasaki; Katsuya Yamasaki, Fujisawa; Akira Ichikawa, Musashino, all of Japan

[73] Assignee: Hitachi, Ltd., Tokyo, Japan

[*] Notice: The portion of the term of this patent subsequent to Dec. 31, 2008 has been disclaimed.

[21] Appl. No.: 776,842

[22] Filed: Oct. 15, 1991

Related U.S. Application Data

[63] Continuation-in-part of Ser. No. 412,987, Sep. 26, 1989, Pat. No. 5,077,798.

[30] Foreign Application Priority Data

Oct. 17, 1990 [JP] Japan .................. 2-276296
Feb. 20, 1991 [JP] Japan .................. 3-025997

[51] Int. Cl.⁶ .............................. G10L 9/00
[52] U.S. Cl. ................................. 395/2.29
[58] Field of Search .................... 381/29–46; 395/2, 2.29, 2.31, 2.3; 375/122

[56] References Cited

U.S. PATENT DOCUMENTS

| | | | |
|---|---|---|---|
| 4,811,398 | 3/1989 | Copperi et al. | 381/36 |
| 4,815,134 | 3/1989 | Picone et al. | 381/31 |
| 4,860,355 | 8/1989 | Copperi | 381/36 |
| 5,077,798 | 12/1991 | Ichikawa et al. | 381/36 |
| 5,086,471 | 2/1992 | Tanaka et al. | 381/36 |

OTHER PUBLICATIONS

S. Roucos, et al., "Segment Quantization for Very-Low-Rate Speech Coding," Proc. ICASSP, 1982, pp. 1565–1568. (English).

Sadaoki Furui, "Digital Speech Processing," Tokai University Press, Sep. 1985, pp. 52–57. (Japanese).

I. A. Gerson, et al., "Vector Sum Excited Linear Prediction (VSELP)," Proc. IEEE Workshop on Speech Coding for Telecommunications, 1989, pp. 66–68. (English).

Primary Examiner—Allen R. MacDonald
Assistant Examiner—Michelle Doerrler
Attorney, Agent, or Firm—Fay, Sharpe, Beall, Fagan, Minnich & McKee

[57] ABSTRACT

A vector quantizing apparatus having a general vector quantization circuit, and a storage means for storing at least one frame of data as the result of comparison by a matching circuit is provided. Further, provided are a speech analysis-synthesis system having a spectral envelope generator for generating a spectral envelope which is so smooth that excessive beating is avoided, a spectral envelope vector converter for sampling the spectral envelope at equal intervals on mel-scale, a vector quantizer for quantizing vectors, and a spectral envelope reconstructor for reconstructing the spectral envelope by interpolation on the basis of combined parabolas.

9 Claims, 18 Drawing Sheets

| INDEX | VECTOR ELEMENT | NEAR VECTOR INDEX | | | | |
|---|---|---|---|---|---|---|
| 1 | $V_{11}, V_{21}, \cdots, V_{n1}$ | $i_{11}$ | $i_{21}$ | $i_{31}$ | ...... | $i_{k1}$ |
| 2 | $V_{12}, V_{22}, \cdots, V_{n2}$ | $i_{12}$ | $i_{22}$ | $i_{32}$ | ...... | $i_{k2}$ |
| : | | | | | | |
| j | $V_{1j}, V_{2j}, \cdots, V_{nj}$ | $i_{1j}$ | $i_{2j}$ | $i_{3j}$ | ...... | $i_{kj}$ |
| : | | | | | | |
| c | $V_{1c}, V_{2c}, \cdots, V_{nc}$ | $i_{1c}$ | $i_{21c}$ | $i_{3c}$ | ...... | $i_{kc}$ |

FIG. 6(a)

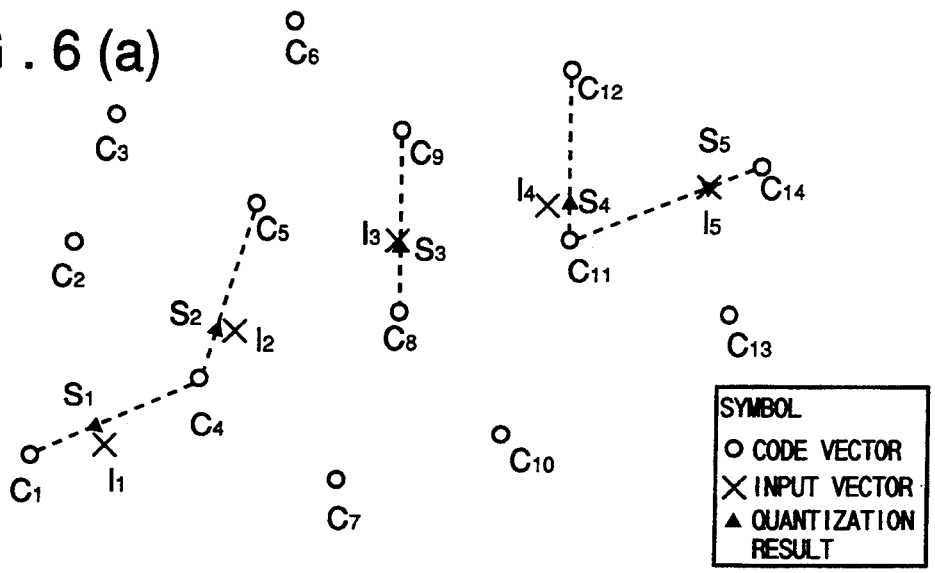

| TIME (FRAME) | 1 | 2 | 3 | 4 | 5 | |
|---|---|---|---|---|---|---|
| INPUT VECTOR | $I_1$ | $I_2$ | $I_3$ | $I_4$ | $I_5$ | |
| NEAREST VECTOR | $C_1$ | $C_4$ | $C_8$ | $C_{11}$ | $C_{14}$ | |
| COMPLEMENTARY VECTOR | $C_4$ | $C_5$ | $C_9$ | $C_{12}$ | $C_{11}$ | ALL TRANSMIT |
| COEFFICIENT | $a_1$ | $a_2$ | $a_3$ | $a_4$ | $a_5$ | |
| QUANTIZATION RESULT | $S_1$ | $S_2$ | $S_3$ | $S_4$ | $S_5$ | |

FIG. 6(b)

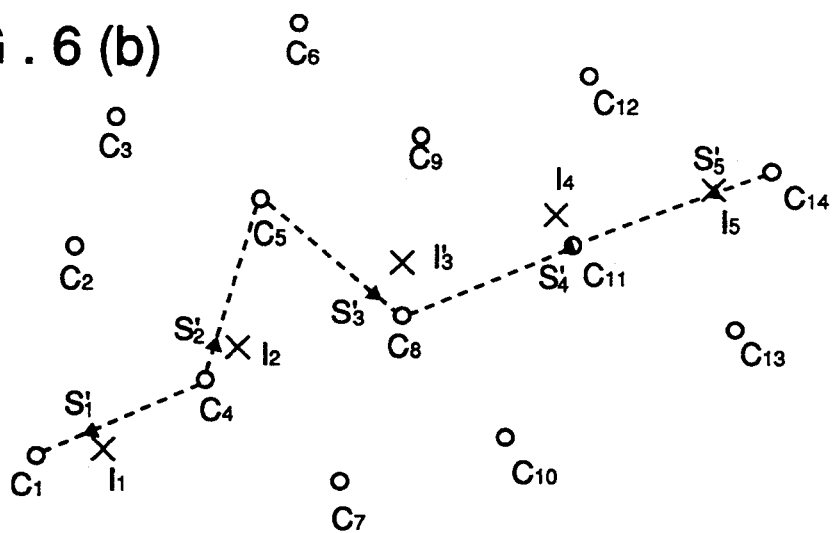

| TIME (FRAME) | 1 | 2 | 3 | 4 | 5 | |
|---|---|---|---|---|---|---|
| INPUT VECTOR | $I_1$ | $I_2$ | $I_3$ | $I_4$ | $I_5$ | |
| PRECEDING FRAME SELECTED VECTOR | $C_1$ | $C_4$ | $C_5$ | $C_8$ | $C_{11}$ | NEED NOT TRANSMIT |
| CURRENT FRAME SELECTED VECTOR | $C_4$ | $C_5$ | $C_8$ | $C_{11}$ | $C_{14}$ | TRANSMIT |
| COEFFICIENT | $a'_1$ | $a'_2$ | $a'_3$ | $a'_4$ | $a'_5$ | |
| QUANTIZATION RESULT | $S'_1$ | $S'_2$ | $S'_3$ | $S'_4$ | $S'_5$ | |

VECTOR QUANTIZING APPARATUS AND SPEECH ANALYSIS-SYNTHESIS SYSTEM USING THE APPARATUS

CROSS REFERENCE TO RELATED APPLICATION

This is a continuation in part of our U.S. application Ser. No. 07/412,987, filed Sep. 26, 1989, now U.S. Pat. No. 5,077,798, issued Dec. 31, 1991 the disclosure of which is hereby incorporated by reference.

BACKGROUND OF THE INVENTION

1. Field of the Invention

The present invention relates to a signal vector quantizing apparatus and a speech analysis-synthesis system using the apparatus. The present invention particularly relates to a vector quantizing apparatus for high quality and low bit rate speech coding and a speech analysis-synthesis system for synthesizing high quality speech from a small amount of information, applied to low bit rate speech transmission, speech storage and forward, etc.

2. Description of the Prior Art

Heretofore, various methods have been proposed for efficient speech coding. For example, not only have various methods have been explained in an easy style but a large number of methods concerning waveform coding and information source coding (parameter coding) have been shown in the reading, by Kazuo Nakata, entitled "Digital Information Compression", Electronic Science Series 100, KOSAIDO SANPOU Co., Ltd., 1984.

On the other hand, heretofore, various methods have been proposed for speech analysis-synthesis. A so-called vocoder is a system particularly improved in information compressing rate. This is a system in which speech is separated into spectral envelope information and source information to be used as parameters. Typical examples of this system include a channel vocoder, an LPC (linear predictive coding) vocoder, a homomorphic vocoder, etc. The outlines thereof have been collected in the reading, by Sadaoki Furui, entitled "Digital Speech Processing", TOKAI UNIVERSITY PRESS, September 1985.

These methods are, however, insufficient in accuracy for extraction of a spectral envelope, so that a problem arises in the quality of synthesized speech.

On the contrary, a PSE (power spectral envelope) analysis-synthesis method has been proposed as a new spectral envelope extracting method recently. This is a method in which a spectral envelope is defined on the basis of a row of data obtained by sampling speech Fourier power spectra at intervals of a pitch frequency. The synthesized speech obtained by this method is high in quality compared with the conventional method. This method has been described in detail in the report, by Takayuki Nakajima et al., entitled "Power Spectral Envelope (PSE) Speech Analysis-Synthesis System", Acoustical Society of Japan, Vol. 44, No. 11, Sho. 63 (1988)-11.

SUMMARY OF THE INVENTION

Of these various methods, the waveform coding method is good in speech quality but is poor in information compressing efficiency. On the other hand, the parameter coding method is high in information compressing efficiency but is poor in speech quality because an upper limit arises on the speech quality regardless of the amount of information. In particular, bit rates of about 5 to about 10 kbps are in a "valley" range to which the two methods cannot be applied. On the contrary, a multipulse method (as described by B. S. Atal et al., "A new model of LPC excitation for producing natural-sounding speech at low bit rates", Proc. ICASSP 82, S-5, 10, 1982, or the like), a TOR method (A. Ichikawa et al., "A speech coding method using thinned-out residual", Proc. ICASSP 85, 25.7, 1985), and the like, have been proposed as hybrid methods formed by combination of the merits of the two methods and have been examined. The hybrid methods are, however, insufficient from the double viewpoint of speech quality and cost required for treatment.

In general, various kinds of high-efficient coding methods are provided to increase assignment of bits to an information-existing region as a measure counter to the uneven distribution of speech information. In addressing the uneven distribution of information as a set of parameters in order to advance the measures positively, a method (called "vector quantization") of increasing assignment of bits to the speech-information-existing region with respect to the set (called "vector") of parameters (for example, S. Roucos et al., "Segment quantization for very-low-rate speech coding", Proc. ICASSP 82, p. 1563, 1982) has become the center of public attention.

In vector quantization, a codebook is used to store a finite number of vectors and indexes as relational data. Vector quantization is considered a quantization process such that an input vector is projected to a finite number of code vectors. Vector quantization is used for information compression because the amount of information used for indexes can be made smaller than the amount of information used for the original vector. A CELP method (for example, B. S. Atal et al., "Stochastic coding of speech signals at very low bit rates", Proc. ICC 84, pp. 1610–1613, 1984) in which vector quantization is applied to a predicted residual of speech, a VSELP method (for example, I. A. Gerson et al., "Vector sum excited linear prediction (VSELP)", Proc. IEEE workshop on speech coding for telecommunications, pp. 66–68, 1989) as an improved method, etc., have been proposed. A technique of minimizing the error between synthesized speech and original speech by using a closed loop is employed in these methods. There arises a problem that not only the amount of information to be processed is large though the quality of synthesized speech is good, but it is difficult to apply the technique to bit rates of not higher than 4.8 kbps.

A good-quality codebook must be generated in advance to attain high-quality speech coding. It is essential that quantization distortion be reduced for improvement of quantization characteristics, but the quantization distortion decreases as the size of the codebook increases. Not only must a very large amount of speech data be used but a large amount of information to be processed is required to generate a large-scale codebook. The size of the codebook is, however, limited from the limitation on the memory capacity and the amount of information required for a searching process.

Fuzzy vector quantization is a method in which quantization distortion can be made less than quantization distortion in the general vector quantization when a codebook of the same size is used. In the fuzzy vector quantization, interpolation is made by using membership functions for an input vector and all code vectors stored in a codebook (for example, H. P. Tseng et al., "Fussy vector quantization applied to hidden Markov modeling", ICASSP 87, 4, 1987). Because the amount of membership function information as information analogous to respective code vectors, however, becomes very large, fuzzy vector quantization has not been used as a transmission technique though improvement of speech quality compared with the quality and size of the codebook can be expected.

The inventors of the present invention have proposed an improved fuzzy vector quantization method adapted to speech coding (U.S. Pat. No. 5,077,798: Japan Patent Application Priority data of Sep. 28, 1988 (Japanese Patent Application No. Sho-63-240972/1988 which is Japanese Patent Unexamined Publication No. Hei-2-90200/1990). In the proposed method, fuzzy vector quantization is performed by using the most neighboring code vector upon an input vector and neighboring vectors registered in a table in advance. Accordingly, the proposed method can be applied to bit rates of not higher than 8 kbps. The proposed method has been further improved to use effective code vectors selectively to reduce quantization distortion at all times (U.S. Pat. No. 5,077,798: Japan Patent Application Priority data of Mar. 13, 1989 (Japanese Patent Application No. Hei-1-57706/1989). Membership functions (the value is zero) of code vectors which are not used, however, need be transmitted. There arises a problem that membership functions predominate at information to be transmitted. It is therefore necessary to reduce the amount of membership function information to reduce the bit rate more greatly.

On the other hand, a method using a plurality of codebooks to transmit code vectors selectively one by one from the respective codebooks to thereby improve robustness against transmission-channel bit error has been proposed in Japanese Patent Unexamined Publication No. Sho-63-285599/1988. In the proposed method, a synthesized vector as an approximation of an input vector is the average of respective code vectors. The number of code vectors is reduced in total because the plurality of codebooks are prepared for a given amount of information. Further, the number of combinations of code vectors coincides with the number of code vectors in the case where one codebook having the same amount of information is used. Accordingly, quantization distortion cannot always be reduced.

The inventors of the present invention have proposed a method (complementary vector quantization) for approximating an input vector by linear combination of a plurality of code vectors registered in one codebook (U.S. Pat. No. 5,077,798: Japan Patent Application Priority data of Aug. 18, 1989 (Japanese Patent Application No. Hei-1-211311/1989). By the proposed method, the amount of information can be reduced very greatly while reduction of quantization distortion is secured in fuzzy vector quantization.

In complementary vector quantization, an input vector is approximated by linear combination of a plurality of code vectors but one of the code vectors used is a code vector (most neighboring vector) which is smallest in distance to the input vector. In most cases of speech signals, there is little change between adjacent frames, so that one code vector is often continued as the most neighboring vector in a period of several frames (this tendency becomes stronger as the size of the codebook decreases).

When one index is continued, the index need not be transmitted at every time. In the conventional methods, however, indexes are transmitted correspondingly to the number of code vectors used for linear combination, so that increase of the amount of information cannot be avoided compared with the general vector quantization method using a codebook of the same size.

An object of the present invention is to provide a vector quantizing apparatus in which the amount of information is reduced more significantly by applying to the aforementioned complementary vector quantizing method a measure to avoid transmission of a part of indexes designating code vectors used for linear combination.

In the speech analysis-synthesis techniques, the PSE analysis-synthesis method has an advantage that high-quality synthesized speech can be obtained but has a disadvantage that the amount of information becomes large because the spectral envelope is expressed by a set (PSE parameter set) of coefficients in a cosine series having 20 terms to 30 terms. In applications such as speech transmission, storage and forward, it is important to reduce the amount of information. The inventors of the present invention have examined a method for reducing the amount of information (bit rate) by vector quantization of PSE parameters. This method has been described in U.S. patent application Ser. No. 07/412987 (Japanese Patent Application Nos. Sho-63-240972/1988, Hei-1-57706/1989, Hei-1-211311/1989, etc.). It has been, however, found that the following problem arises in vector quantization of PSE parameters.

The power spectral envelope of speech is defined by PSE parameters in the form of a set thereof. Accordingly, individual parameters do not directly correspond to frequency components of the spectral envelope expressing the acoustic characteristic of speech or time components of an impulse response waveform transformed from the spectral envelope. This fact shows that quantization distortion produced in respective parameters by vector quantization of PSE parameters has a complex relation with influence thereof on the quality of synthesized speech. As a result, improvement of vector quantization characteristic is, in most cases, not directly connected to improvement of the quality of synthesized speech.

A second object of the present invention is to reconstruct original parameters from a quantized vector by picking up parameters as a vector to connect improvement of vector quantization characteristic directly to improvement of the quality of synthesized speech, in the case where vector quantization is applied to speech analysis-synthesis.

A spectral envelope defined from logarithmic power spectra sampled at integral multiples of a pitch frequency by the method proposed by Nakajima et al. often has a form of excessive beating according to the speech. As a result, unnatural emphasis or unnatural suppression occurs in specific frequency components of the spectra. There arises a problem that the quality of synthesized speech deteriorates.

A third object of the invention is to generate a spectral envelope free from excessive beating.

In addressing the first object, a storage circuit for storing at least one frame of collation results obtained by a collation circuit may be provided additionally to general vector quantizing circuit (a codebook, a circuit for collating an input vector with code vectors, and a circuit for reconstructing the input vector). The collation circuit and the reconstruction circuit are controlled by reference to an index transmitted in the preceding frame and stored in the storage circuit.

The following advantages and the like are obtained as the operation of the invention.

Various changes of the invention can be considered. The operation of the invention will be described as to a typical procedure among the changes of the invention.

When speech to be transmitted is inputted, the speech is separated into frames (blocks). A characteristic vector (hereinafter called "input vector") is extracted from one frame in a vector transformer (analyzer). A code vector (most neighboring vector) smallest in distance to the input vector is selected by successively comparing the input vector with code vectors registered in a codebook. At this time, the distance between the input vector and the most neighboring vector is equivalent to quantization distortion in general vector quantization.

In complementary vector quantization (U.S. Pat. No. 5,077,798), a code vector to be combined with the most neighboring vector is selected. Candidates for the vector to be combined are registered in the codebook in advance for every code vector. (In general, the candidates are code vectors small in distance from the code vector and are hereinafter called "neighboring vectors"). Specifically, candidate code vectors registered relationally to the most neighboring vector are successively picked up and combined with the most neighboring vector to approximate the input vector by linear combination. At this time, coefficients of linear combination are determined to make the approximation best. Approximation errors (equivalent to quantization distortion) are calculated by using optimum coefficients for respective candidate vectors, so that a candidate vector smallest in the error is selected.

According to the present invention, a code vector corresponding to an index transmitted in the preceding frame is always used as one of code vectors used for complementary vector quantization, to make a part of transmission of indexes unnecessary. The following procedure is carried out to prevent the increase of quantization distortion caused by this technique.

An index transmitted in the preceding frame and stored in the storage circuit is read. Then, indexes of neighboring vectors (used as candidates for a code vector to be combined with the most neighboring vector) upon the code vector corresponding to the index thus read are read by reference to the codebook. A judgment is made as to whether the preliminarily detected most neighboring vector in the current frame coincides with any one of the code vector transmitted in the preceding frame and the neighboring vectors. When coincidence is obtained, complementary vector quantization is executed by using the code vector transmitted in the preceding frame (the code vector is hereinafter called "transmitted code vector" for simplification of description, though, in fact, the code vector itself is not transmitted but the index thereof is transmitted) and the neighboring vector. When coincidence is not obtained, complementary vector quantization is executed by using the most neighboring vector in the current frame additionally to the aforementioned code vector.

In any case, transmitted information is the index of the code vector combined with the transmitted code vector in the preceding frame and the optimum coefficient at that point of time.

Reconstruction of the input vector is made as follows. A code vector subjected to linear combination is read from the codebook on the basis of the index transmitted in the preceding frame and stored in the storage circuit and the index transmitted in the current frame. The input vector is reconstructed by using coefficients transmitted in the current frame. At this point of time, the index stored in the storage circuit is erased and the index transmitted in the current frame is stored.

The result based on the aforementioned operation of the invention is as follows, compared with the prior art.

(1) When the most neighboring vector in the current frame coincides with the transmitted vector in the preceding frame, the result perfectly agrees with the result of conventional complementary vector quantization.

(2) When the most neighboring vector in the current frame coincides with one of neighboring vectors upon the transmitted vector in the preceding frame, the probability that the most neighboring vector in the current frame is selected as a vector complementary to the transmitted vector in the preceding frame is high. Also in the conventional method in which complementary vector quantization is executed by using the most neighboring vector in the current frame as a nuclear vector, the probability that the transmitted vector in the preceding frame becomes one of neighboring vectors in the current frame is high. Accordingly, the same result as in the conventional method is obtained in the method of the present invention.

(3) When the most neighboring vector in the current frame does not coincide with any one of the transmitted vector in the preceding frame and the neighboring vectors, the characteristic of the input signal changes widely in the current frame, differently from the paragraphs (1) and (2). In this case, the probability that the transmitted vector in the preceding frame and neighboring vectors thereupon do not coincide with neighboring vectors upon the most neighboring vector in the current frame is high. Accordingly the result is different from the result based on the conventional method. In the method of the present invention, however, the most neighboring vector in the current frame is always selected as a complementary vector. Because arbitrary combination of code vectors is guaranteed to have no influence on the increase of quantization distortion in complementary vector quantization (compared with the general vector quantization), there is no increase of quantization distortion in the complementary vector quantization compared with the general vector quantization. There is an advantage brought by transmission of coefficients of linear combination. Even upon the premise that the transmitted vector in the preceding frame is always used, the bad influence in the case where the characteristic of the signal changes widely can be avoided.

According to the present invention, the number of indexes to be transmitted can be reduced with almost no increase of quantization distortion compared with the conventional method, so that information compression can be made very greatly.

In addressing the second object of the invention, a circuit may be provided for vector quantization of frequency components of a spectral envelope or impulse response waveform samples which have obvious correspondence to the quality of synthesized speech. That is, in the case where a spectral envelope is subjected to vector quantization, a spectral envelope vector conversion circuit may be provided for extracting data of the number corresponding to the number of vector dimensions in vector quantization from spectral envelope data having predetermined frequency resolution, and a spectral envelope reconstruction circuit for reconstructing the spectral envelope from data after vector quantization. In the case where impulse response is subjected to vector quantization, circuit may be provided for extracting samples of the number corresponding to the number of vector dimensions in vector quantization from impulse response waveform samples having predetermined time resolution, and a circuit may be provided for reconstructing the impulse response waveform from data after vector quantization.

In addressing the third object of the invention, a spectral envelope generation circuit may be provided for generating a spectral envelope from data sampled at intervals of the pitch frequency of logarithmic power spectra of speech on the basis of parabolic interpolation.

The following advantages are attained as the operation of the invention.

The operation of the invention in the case where a spectral envelope is subjected to vector quantization will be described hereunder.

In the spectral envelope vector conversion circuit, a spectral envelope (a row of logarithmic power value data arranged at intervals of a predetermined frequency (frequency resolution)) is inputted to obtain a spectral envelope vector for vector quantization. Specifically, spectral envelope data having normalized logarithmic power values are obtained by calculating the average of the row of data and then subtracting the average from the respective data. Then, a spectral envelope vector is obtained by resampling data of the number corresponding to the number of vector dimensions from the normalized spectral envelope data at intervals of a frequency to arrange the data at equal intervals on mel-scale (that is, at intervals to arrange the data in high density in the low-frequency region and arrange the data in low density in the high-frequency region). Synthesized speech less in deterioration of acoustic quality can be reproduced even if the number of vector dimensions is small, by resampling data at equal intervals on mel-scale.

In the spectral envelope reconstruction circuit, the original spectral envelope data are reconstructed from the vector quantized by vector quantization. When the quantized vector is rearranged on the frequency axis, data are arranged at irregular intervals. Data between these data are obtained by interpolation. Specifically, a value between two data is interpolated by weightingly adding two parabolas passing the two data to apply parabolic interpolation to three continuous data. That is, the interpolated value is the weighted average of two parabolas. The spectral envelope is reconstructed by adding the average of logarithmic power values subtracted at the time of normalization to the interpolated data.

The operation of the invention in the case where an impulse response waveform is subjected to vector quantization will be described hereunder.

In the impulse response vector conversion circuit, zero-phased impulse response (a row of amplitude value data arranged at intervals of a predetermined time (time resolution)) is inputted to obtain an impulse response vector for vector quantization. Specifically, data at the time 0 and above are extracted because the zero-phased impulse response is symmetric with respect to the time 0. Then, because the amplitude value of the data at the time 0 is maximum, the amplitude is normalized by dividing the amplitude values of the other data by the maximum value. Then, an impulse response vector is obtained by resampling the normalized-amplitude impulse response waveform samples to arrange the number corresponding to the number of vector dimensions at equal intervals of a distance in order of starting from the sample at the time 0. A value preliminarily determined as a function of the pitch cycle is selected as the distance for resampling. An impulse vector keeping its acoustically important characteristic can be obtained by the aforementioned procedure.

In the impulse response reconstruction circuit, the original impulse response waveform data are reconstructed from the vector quantized by vector quantization. Because information related to the cut portions as exceeding the number of vector dimensions has been lost, the original data are reconstructed as follows. Linear predictive coefficients are obtained by linear predictive analysis while regarding quantized data as a waveform. Waveforms as exceeding the number of vector dimensions are predicted by using the coefficients and extrapolated. Extrapolation waveforms to make coincidence between quantized data and speech path characteristic can be obtained by the aforementioned procedure.

The zero-phased impulse response waveform is reconstructed by generating a waveform symmetric with respect to the time 0 through reconstructing amplitude values by multiplying amplitude values, inclusive of the extrapolated portions, by the maximum amplitude value used for amplitude normalization.

In the spectral envelope generation circuit to attain the third object of the invention, a row of logarithmic power value data sampled at integral multiples of the pitch frequency are inputted to generate a spectral ,envelope. Specifically, a spectral envelope is generated by parabolic interpolation and weighting addition in the same manner as in the aforementioned spectral envelope reconstruction circuit. A smooth spectral envelope free from excessive beating can be obtained by the aforementioned procedure.

The foregoing and other objects, advantages, manners of operation and novel features of the present invention will be understood from the following detailed description when read in connection with the accompanying drawings.

BRIEF DESCRIPTION OF THE DRAWINGS

FIG. 6(a) is a view for explaining conventional complementary vector quantization;

FIG. 6(b) is a view for explaining sequentially complementary vector quantization according to the present invention;

DESCRIPTION OF THE PREFERRED EMBODIMENTS

Embodiments of the present invention will be described hereunder with reference to the drawings.

Figure 2:
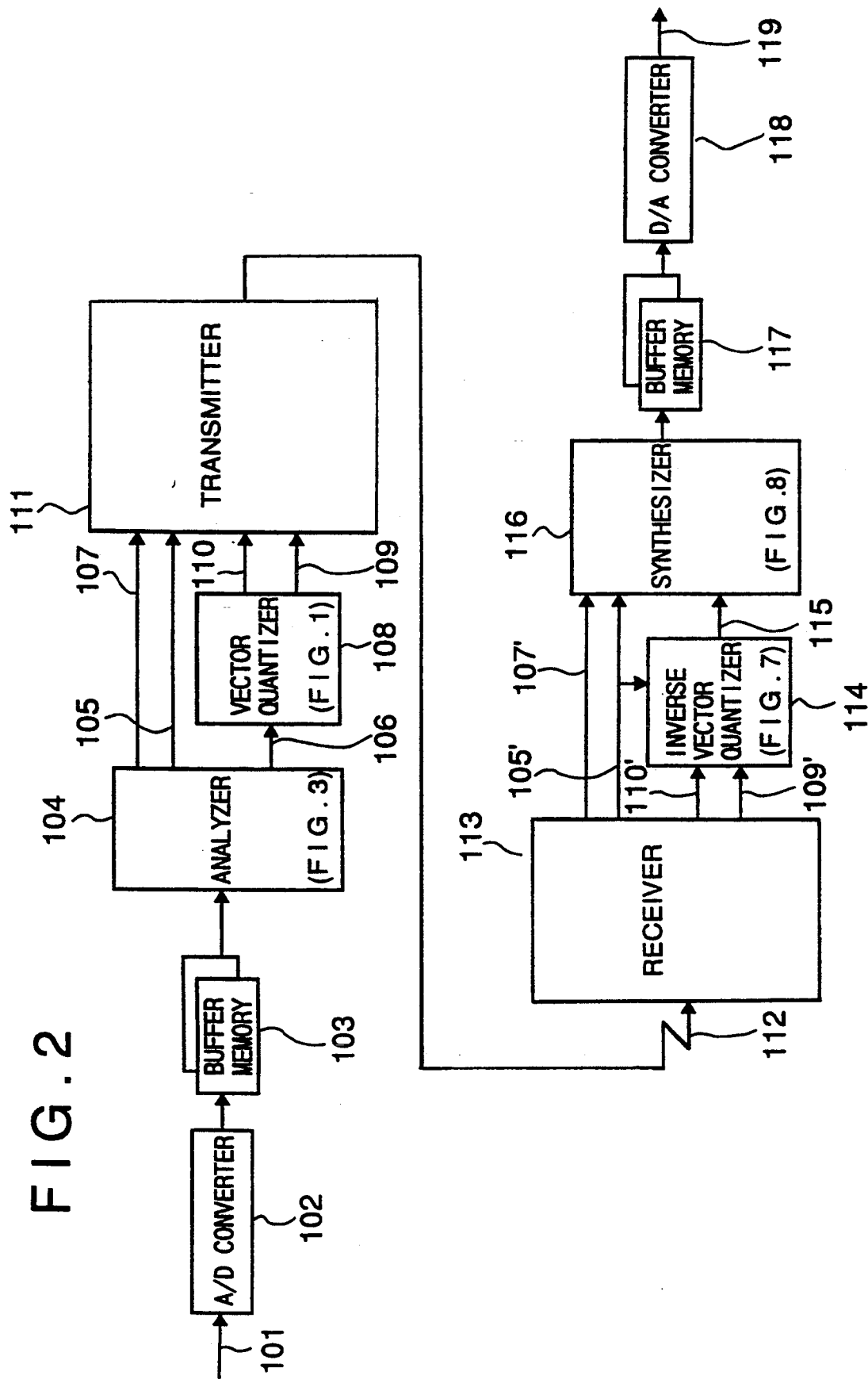
FIG. 2 is a block diagram for explaining the system configuration of a speech coding system as an embodiment of the present invention.

FIG. 2 is a block diagram for explaining the speech coding system using a vector quantizing apparatus according to the present invention. In the drawing, a one-directional communication path on the transmitter side and the receiver side which form a pair is shown but a reverse-directional communication path is not shown to avoid the complication of the drawing. Vector quantization as a quantization process is separated into a process for outputting indexes and the like and a process for reconstructing vectors from the indexes and the like. Hereinafter, for the sake of convenience, the former is called "vector quantization" and the later is called "inverse vector quantization".

In FIG. 2, input speech 101 is inputted into a buffer memory 103 having two pages, via an analog-to-digital (A/D) converter 102. This memory is provided for the double purpose of adjusting timing in the following procedure and preventing the interruption of the input speech. The speech from the buffer memory 103 is inputted into an analyzer 104 to obtain pitch information 107, spectral information 106 and level information 105. The spectral information 106 is given to a vector quantizer 108 according to the present invention to obtain an index 109 and a coefficient 110 of linear combination. The index 109, the coefficient 110, the pitch information 107 and the level information 105 are transmitted to a receiver 113, via a transmitter 111 and a transmission channel 112. In the receiver side, the index 109', the coefficient 110' and the level information 105' received by the receiver are supplied to an inverse vector quantizer 114 to reconstruct the spectral information 115 to be given to a synthesizer 116, together with the pitch information 107' and the level information 105'. In the synthesizer 116, a speech waveform is decoded and converted into an analog signal by a digital-to-analog (D/A) converter 118 via an output buffer memory 117 having two pages, to reconstruct output speech 119.

The respective portions will be described in detail hereunder.

Figure 3:
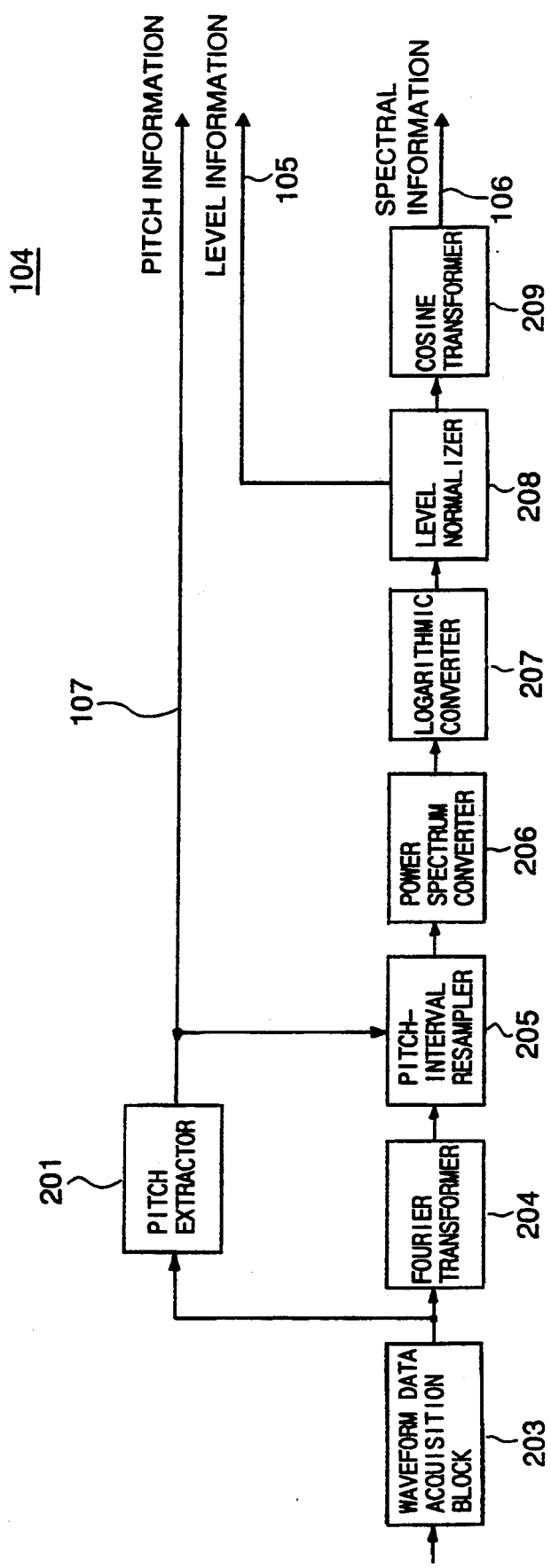
FIG. 3 is a diagram for explaining the analyzer in FIG. 2.

FIG. 3 is a diagram for explaining the analyzer 104. In this embodiment, the analyzer uses a power spectral envelope (PSE) analyzing method. The PSE analyzing method has been described in detail in the above paper, by Nakajima et al., "Power Spectral Envelope (PSE) Speech Analyzing/Synthesizing System", Acoustical Society of Japan, Vol. 44, No. 11, Sho-63-11/1988. The method will be summarized hereunder.

In FIG. 3, a waveform data acquisition block 203 serves to excise waveform frames from the input speech to apply pitch extraction and spectrum analysis thereto. Waveform frame length is in a range of from about 20 ms to about 60 ms. The frames are generally excised so that the frames overlap adjacent frames by a length in the range of one-third to one half the waveform frame length. A pitch extractor 201 serves to extract pitch information (pitch frequency or pitch cycle) of the input speech. A known method such as a correlation method, an AMDF method, etc., can be used for pitch extraction. The excised waveform frames are also delivered to a Fourier transformer 204 to be transformed into Fourier series. Fast and high frequency resolution data can be obtained by using fast Fourier transform (FFT) after a number, 2048, of data are produced by multiplying the respective excised waveform frame by a generally used window function such as a hamming window and then filling front and rear space with data of zero. The frequency components, that is, spectra, of the excised waveform are expressed as the absolute values of Fourier coefficients. When the excised waveform has a cyclic structure, the spectra have a linear spectral structure based on harmonics of the pitch.

A pitch-interval resampler 205 extracts harmonic components (linear spectral components) of the pitch frequency from the spectral information obtained by the FFT. A power spectrum converter 206 squares the respective resampled spectral components to be transformed into power spectra. Then, a logarithmic converter 207 performs logarithmic conversion on the respective components to obtain logarithmic power spectra.

A level normalizer 208 serves to absorb the level change based on the loudness of the input speech. The level change may be, however, collectively extracted in a cosine transformer 209 as the next stage.

The cosine transformer 209 approximately expresses the logarithmic power spectra in the form of a finite-term cosine series by using the resampled data. The number, $\underline{m}$, of terms is generally set to about 25. The power spectral envelope is expressed as follows.

$$Y(\lambda) = A_0 + A_1 \cos\lambda + A_2 \cos2\lambda + \ldots + A_m \cos m\lambda \quad (1)$$

The respective coefficients $A_i$ (i=0, 1, ..., m) are obtained to minimize the square error between the resampled power spectral data and $Y(\lambda)$ calculated according to the expression (1). The coefficient $A_0$ is outputted as level information 105, because the zero-order term $A_0$ expresses the input level. The coefficients $A_1, ..., A_m$ are outputted as spectral information 106. Because $\{A_1, ..., A_m\}$ is regarded as a vector, the analyzer substantially serves as a vector converter.

Figure 1:
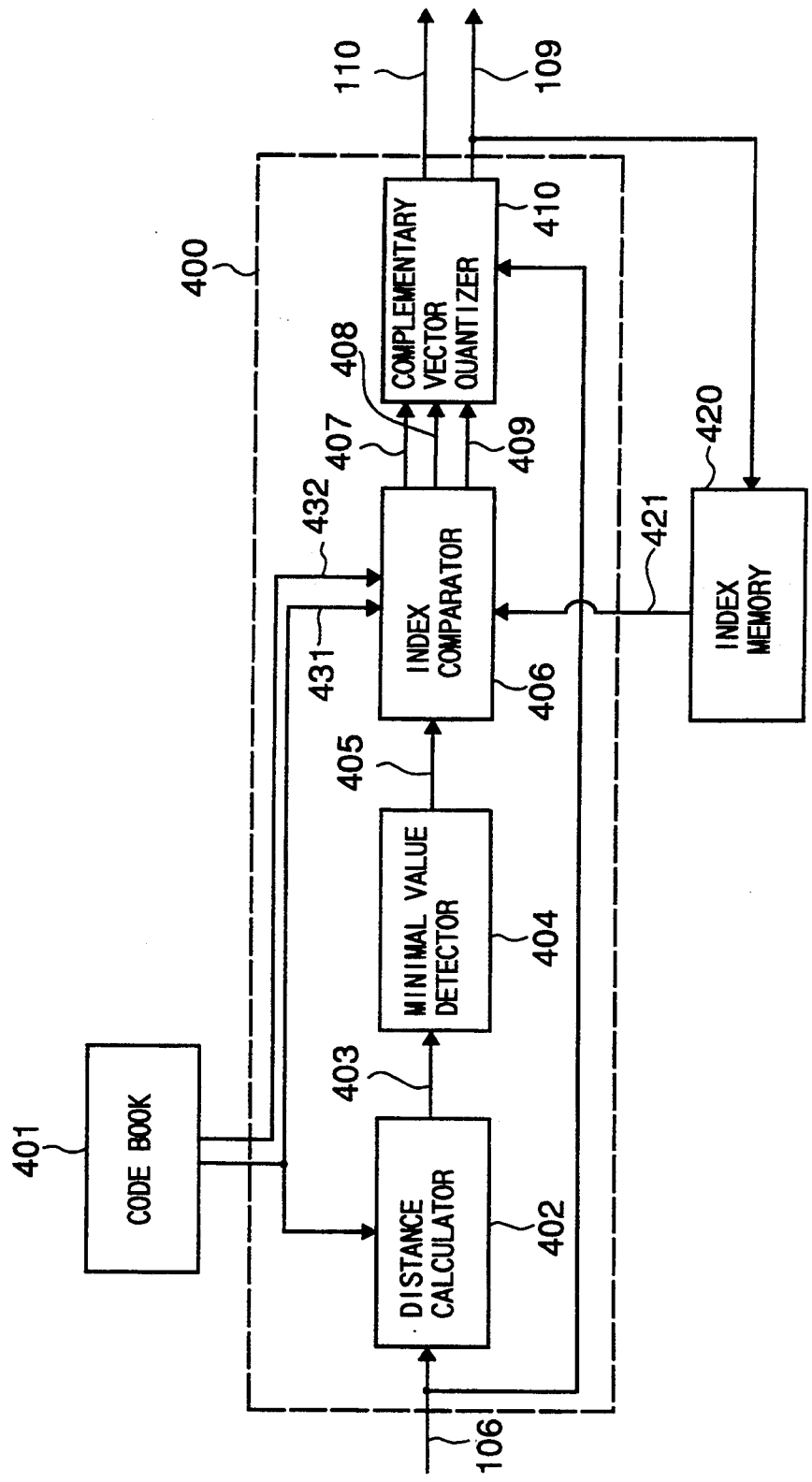
FIG. 1 is a diagram for explaining an embodiment of a vector quantizing apparatus according to the present invention.
Figures 4, 5:
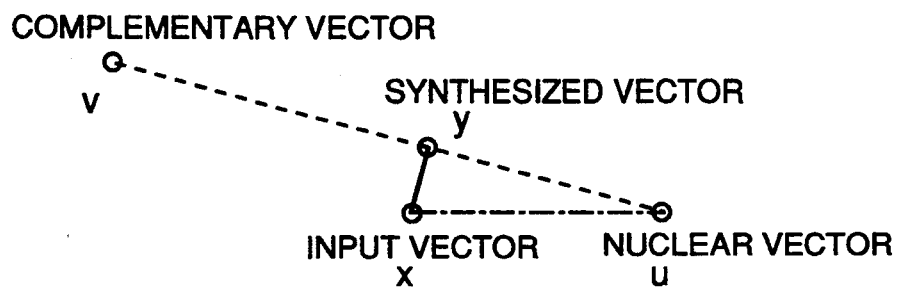
FIG. 4 is a view showing the structure of the codebook in FIG. 1.
FIG. 5 is a view for explaining input vector approximation based on linear combination.

The vector quantizer according to the present invention will be described hereunder with reference to FIG. 1. In FIG. 1, element values 431 of code vectors and indexes 430 thereof are stored in a codebook 401. For the purpose of candidate vector selection which will be described later, indexes 432 of code vectors (hereinafter called "neighboring vectors") small in distance to each code vector are stored correspondingly to each code vector. The structure of the codebook used in this embodiment is shown in FIG. 4. In FIG. 4, $\underline{c}$ represents the number of code vectors (codebook size), $\underline{n}$ represents the number of dimensions in each code vector, and $\underline{k}$ represents the number of neighboring vectors per one code vector. The number $\underline{k}$ is set to reduce the amount of information to be processed and is generally sufficiently small compared with $\underline{c}$ ($\underline{k}$ is about 32 when $\underline{c}$ is 1024).

Returning to FIG. 1, a matching block 400 will be described hereunder. When spectral information (input vector) 106 is inputted, elements 431 of respective code vectors are read from the codebook 401 to calculate the distances between the input vector and the elements 431 in a distance calculator 402. Although Euclidean distance obtained by weighting the respective vector elements is used as the distance scale, it is a matter of course that other suitable scales may be used. In the case of searching all numbers, distance values 403 for all code vectors in the codebook are calculated and supplied to a minimal value detector 404. The minimal value detector 404 outputs the index 405 of the code vector (most neighboring vector) having the minimal distance value 403. Various kinds of codebook searching methods have been proposed mainly to reduce the amount of information to be processed, and any one of them may be employed.

The code vector selecting method as a subject of the present invention will be conceptually described hereunder in comparison with the conventional complementary vector quantization method (hereinafter called "complementary VQ") before a specific procedure will be described.

FIG. 6(a) shows the relations among code vectors ($C_1$ to $C_{14}$), input vectors ($I_1$ to $I_5$) and results ($S_1$ to $S_5$) of quantization based on the conventional complementary VQ on the assumption of two-dimensional vector space for simplification of description.

The code vectors are vectors respectively representing clusters in the case where the vector space is separated into a plurality of clusters. On the other hand, the input vectors $I_1$ to $I_5$ expresses time sequence (so as to correspond to the points of time or correspond to the frame numbers 1 to 5), so that the input vectors, in most cases as in speech signals, move in the vector space continuously as shown in FIG. 6(a).

The conventional complementary VQ which will be described later in detail with reference to FIG. 5 can be described now in brief in that a vector newly synthesized by linear combination of two code vectors is used as a result of quantization of an input vector. Specifically, in the case of an input vector $I_1$, a code vector $C_1$ at the smallest distance to the input vector $I_1$ and a code vector $C_4$ in neighboring vectors registered therein are selected as the most neighboring vector and the complementary vector, to thereby determine a coefficient $a_1$ and obtain a synthesized vector $S_1$ as the result of quantization. In the case of an input vector $I_2$, code vectors $C_4$ and $C_5$ and a coefficient $a_2$ are selected in the same manner as described above. In the case of an input vector $I_3$, code vectors $C_8$ and $C_9$ and a coefficient $a_3$ are selected in the same manner as described above. The indexes of the code vectors and the coefficient are transmitted. The relations are shown in the table of FIG. 6(a).

FIG. 6(b) shows the results of vector quantization according to the present invention. Code vectors $C_1$ to $C_{14}$ and input vectors $I_1$ to $I_5$ are equivalent to those in FIG. 6(a).

According to the present invention, a code vector transmitted in the preceding frame is always used as one of two code vectors to be combined.

With respect to the input vector $I_1$, (it is assumed in this case that) the most neighboring vector is $C_1$ and is a vector transmitted in the preceding frame. Accordingly, in this case, the complementary vector $C_4$ is selected to determine a coefficient $a_1'$ in the same manner as in the convention complementary VQ. The coefficient $a_1'$ and the result $S_1'$ of quantization coincide with $a_1$ and $S_1$ in FIG. 6(a). Parameters to be transmitted are however the index of $C_4$ and the coefficient $a_1'$. In short, the index of $C_1$ need not be transmitted.

With respect to the input vector $I_2$, the result of quantization is the same as the result of the conventional complementary VQ. With respect to the input vector $I_3$, a code vector $C_5$ is unconditionally selected in the present invention because the code vector $C_5$ has been transmitted in the preceding frame, though code vectors $C_8$ and $C_9$ are selected in the conventional system. Because the most neighboring vector upon the input vector $I_3$ is $C_8$, another vector is selected from a group obtained by adding $C_8$ to neighboring vectors upon $C_5$. In the case of FIG. 6(b), $C_8$ is selected, so that the result of quantization is $S_3'$. The result $S_3'$ is different from $S_3$ in FIG. 6(a) in that quantization distortion ($\|S_3'\text{-}I_3\|$) is increased slightly more than quantization distortion ($\|S_3\text{-}I_3\|$) in the conventional system. With respect to the input vector $I_4$, the result of quantization is different from the result in the conventional complementary VQ. With respect to the input vector $I_5$, the result of quantization is the same as that in the conventional complementary VQ.

In any case, parameters to be transmitted are the index of a selected code vector and a coefficient. The relations are shown in FIG. 6(b).

Returning to FIG. 1, a specific procedure will be described hereunder.

In an index comparator 406, the index 421 of a code vector transmitted in the preceding frame is read from an index memory 420. Then, elements 431 of a code vector corresponding to the index 421 and indexes 432 of neighboring vectors are read by reference to the codebook 401. Assuming now that the specific value of the index 421 is j, then elements $v_{lj}, ..., v_{nj}$ of a code vector corresponding to the index j and indexes $i_{lj}, ..., i_{kj}$ of neighboring vectors are read from the codebook 401 as shown in FIG. 4. Further, elements 431 of code vectors corresponding to the indexes of the neighboring vectors are read.

As will be described later, a code vector corresponding to the index transmitted in the preceding frame is always used in the complementary vector quantizer 410 before a code vector (called "complementary vector") to be combined therewith is selected from a plurality of candidate vectors. Parameters outputted from the index comparator 406 are elements 407 of a code vector transmitted in the preceding frame (in which the code vector is called "transmitted code vector" for simplification of description though the code vector is not really transmitted but the index thereof is really transmitted as described above), elements 408 of code vectors as candidate code vectors to be combined therewith, and indexes 409 thereof.

A candidate vector selecting method is as follows. A judgment is made as to whether the index 405 of the most neighboring vector upon the input vector 106, as the output from the minimal value detector 404, coincides with any one of the index 421 transmitted in the preceding frame and indexes of neighboring vectors upon the code vector (transmitted code vector) corresponding to the index 421. When coincidence is obtained, $\underline{k}$ neighboring vectors upon the transmitted code vector are regarded as candidate vectors. When, on the contrary, the index 405 of the most neighboring vector does not coincide with any one, the number of candidate vectors is set to $(\underline{k}+1)$ by adding the most neighboring vector upon the input vector 106 to the $\underline{k}$ neighboring vectors upon the transmitted code vector. If the number of candidate vectors must be set to $\underline{k}$ for limitation of the amount of information to be processed, candidate vectors are selected as follows.

Subjects of comparison are limited to $(\underline{k}-1)$ neighboring vectors. When coincidence is obtained, $\underline{k}$ neighboring vectors are all used as candidate vectors. When coincidence is not obtained, $\underline{k}$ code vectors obtained by adding the most neighboring vector upon the input vector 106 to the $(\underline{k}-1)$ neighboring vectors are used as candidate vectors.

The complementary vector quantizer 410 will be described hereunder. Complementary vector quantization will be described briefly because it has been described in detail in the above U.S. patent application Ser. No. 07/412987.

Complementary vector quantization is based on approximation of an input vector by combination of code vectors. Although various approximating methods may be considered, the case of approximation by linear combination of two code vectors is described here. One (hereinafter called "nuclear vector") of the two code vectors is a code vector transmitted in the preceding frame.

The principle of approximation of an input vector by linear combination of two code vectors will be described with reference to FIG. 5. In FIG. 5, vectors are expressed as two-dimensional vectors for simplification of description.

The vector (approximate vector) synthesized by linear combination is formed on a line passing two vectors $\underline{u}$ and $\underline{v}$. The synthesized vector is located on a point obtained by dividing a line segment between $\underline{u}$ and $\underline{v}$ internally or externally, correspondingly to the sign and size of the weighting coefficient. Weighting of linear combination is determined to minimize approximation error (the distance between the synthesized vector and the input vector, that is, quantization distortion). As is obvious from FIG. 5, the quantization distortion can be reduced by approximating the input vector by two code vectors.

It is generally assumed that the number of vector dimensions is $l$. Let the input vector be $x=\{x_1, x_2, \ldots, x_L\}$. Let the nuclear vector be $u=\{u_1, u_2, \ldots, u_L\}$. Let the code vector (hereinafter called "complementary vector") to be combined with the nuclear vector be $v=\{v_1, v_2, \ldots, v_L\}$. Assuming that coefficients of linear combination are w and (1-w), then the approximate vector $y=\{y_1, y_2, \ldots, y_L\}$ is expressed by the expression (2):

$$y = wu + (1-w)v \qquad (2)$$

in which the coefficient $\underline{w}$ is determined to minimize the approximation error $|x-\underline{y}|$.

When the square error is represented by $Q_D^2$, the square error is expressed by the following expression (3).

$$Q_D^2 = \sum_{i=1}^{l} \{wv_i + (1-w)u_i - x_i\}^2 \qquad (3)$$

When the expression is partially differentiated by $\underline{w}$ and then rearranged while the value of the expression is set to zero, the coefficient $\underline{w}$ is calculated as follows.

$$w = \frac{\sum_{i=1}^{l} (u_i - w_i)(u_i - v_i)}{\sum_{i=1}^{l} (v_i - u_i)^2} \qquad (4)$$

Although above description is made upon the case where two code vectors are used, a set of coefficients $(w_1, w_2, \ldots)$ can be calculated in the same manner as described above in the case where three code vectors or more are used. Although above description is made upon the case where one codebook is used, it is a matter of course that a plurality of independent or dependent codebooks may be used to select code vectors therefrom.

The last half of the complementary vector quantizer 410 will be described hereunder with reference to FIG. 1. The coefficient in the expression (4) is calculated by successively combining $\underline{k}$ or $(\underline{k}+1)$ candidate vectors with the nuclear vector, to thereby calculate the square error of the expression (3). The index 109 of a candidate vector being minimum in the square error, that is, approximation error, and the coefficient 110 at this time are outputted. At this point of time, the index 421 stored in the index memory 420 and transmitted in the preceding frame is erased, so that the index 109 transmitted in the current frame is newly stored as 421.

As the aforementioned example, the input vector is approximated by linear combination of code vectors while the coefficient of linear combination is determined to minimize the approximation error. As another example, the coefficient may be determined on the basis of the thought of fuzzy vector quantization.

Fuzzy vector quantization will be described in brief because it has been described in detail in the report, by Nakamura et al., "Normalization of Spectrogram using Fuzzy Vector Quantization", Acoustical Society of Japan, Vol. 45, No. 2, 1989, and reports quoted therein.

In fuzzy vector quantization, the input vector is expressed by the degree of reversion to a plurality of code vectors. The degree of reversion is evaluated by a membership function. An example of calculation of such a membership function is shown in the following expression.

When $c$ code vectors $(v_1, \ldots, v_c)$ are considered as subjects, the distance between input vector $x_k$ and code vector $v_i$ is represented by $d_{ik}$. When the input vector does not coincide with any code vector, the membership function $u_{ik}$ with respect to each code vector is calculated by the following expression:

$$u_{ik} = \frac{1}{\sum_{i=1}^{c} \left( \frac{d_{ik}}{d_{jk}} \right)^{\frac{1}{p-1}}} \quad (5)$$

in which $p$ represents a parameter called fuzziness and generally having a value of about 1.5. When the input vector coincides with any code vector, the value of the membership function with respect to the code vector is set to 1 so that the values of the other membership functions are set to 0.

Inverse quantization for reconstructing vectors from membership functions will be described hereunder. The reconstructed vector $y$ is expressed by linear combination of code vectors.

$$y = \frac{\sum_{i=1}^{c} [(u_{ik})^p v_i]}{\sum_{i=1}^{c} (u_{ik})^p} \quad (6)$$

The error (distance) between the input vector $x_k$ and a reconstructed vector $y$ is quantization distortion based on fuzzy vector quantization. In the case of fuzzy vector quantization, parameters of the function are membership functions. Because the sum of all the membership functions becomes 1 from the nature thereof, the sufficient number of membership functions to be given is smaller by one than the number of code vectors required for approximation of the input vector.

The above example shows the case where quantization distortion is used as a standard for selecting complementary vectors. As another example, vectors can be selected by providing local decoders to use the error scale on the same dimension as in the input signal as an evaluation standard.

In the following, the decoder side (receiver side) is described.

Figure 7:
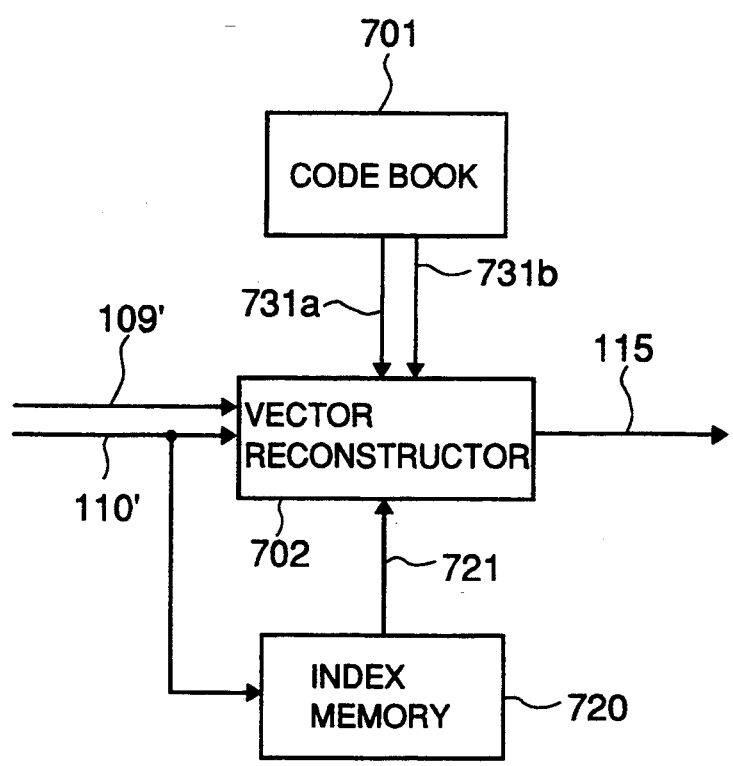
FIG. 7 is a diagram for explaining the inverse vector quantizer in FIG. 2.

FIG. 7 is a diagram for explaining the inverse vector quantizer 114 for reconstructing the input vector from the transmitted parameters (indexes and coefficients). An index 721 received in the preceding frame is read from an index memory 720. Then, elements 731a of a nuclear vector are read from a codebook 701. It is a matter of course that the receiver-side codebook 701 has the same content as that of the transmitter-side codebook 401. Indexes of neighboring vectors upon respective code vectors need not be transmitted.

Elements 731b of a complementary vector are read from the codebook 701 on the basis of an index 109' received in the current frame, in the same manner as described above. A vector is reconstructed according to the aforementioned expression (2) (or the expression (6) in the case of fuzzy vector quantization) in a vector reconstruction portion 702 by using these vector elements 731a and 731b and a received coefficient (or a set of coefficients) 110'. The reconstructed vector $y = \{A_1',$ $A_2', \ldots, A_m'\}$ as spectral information 115 is delivered to the synthesis portion 116.

At this point of time, the index stored in the index memory 720 and received in the preceding frame is erased, so that the index 109' received in the current frame is newly stored as 721. Although above description is made upon the case where the index 109' is stored in the index memory 720, the invention can be applied to the case where the elements 731a of the nuclear vector may be stored. In this case, the elements 731a of the nuclear vector need not be read from the codebook 701 in the next frame, but the memory capacity increases.

Figure 8:
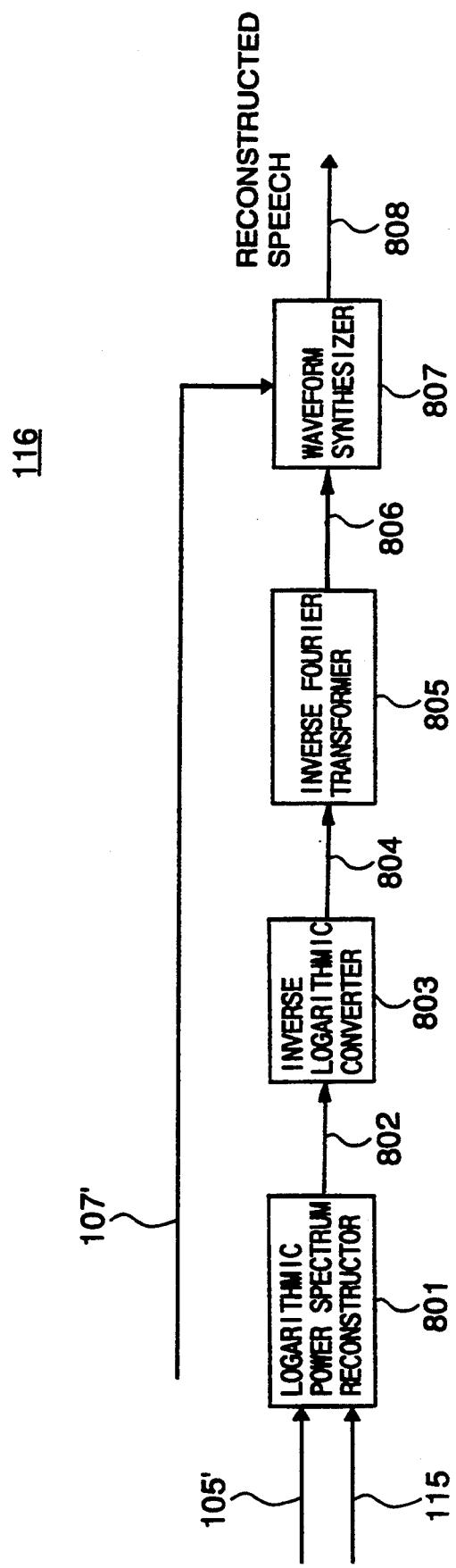
FIG. 8 is a diagram for explaining the synthesizer in FIG. 2.

In the following, the synthesizer 116 is described with reference to FIG. 8. In FIG. 8, a logarithmic power spectrum reconstructor 801 obtains logarithmic power spectra Y' 802 according to the following expression (7) by using the transmitted level information $A_0'$ 105' and the respective elements $A_1', A_2', \ldots, A_m'$ of the reconstructed vector (spectral information 115).

$$Y'(\lambda) = A_0' + A_1' \cos\lambda + A_2' \cos 2\lambda + \ldots + A_m' \cos m\lambda \quad (7)$$

The reconstructed logarithmic power spectra Y' 802 are transformed by $(\frac{1}{2})\log^{-1}$ in an inverse logarithmic converter 803 to obtain zero-phased spectra 804 to be delivered to an inverse Fourier transformer 805. The inverse Fourier transformer 805 obtains speech waveform segments 806 by inverse fast Fourier transform (IFFT). The speech waveform segments 806 are added to one another in a waveform synthesizer 807 while successively shifted by the pitch distance according to the pitch information 107', to thereby output reconstructed speech 808.

Figure 9:
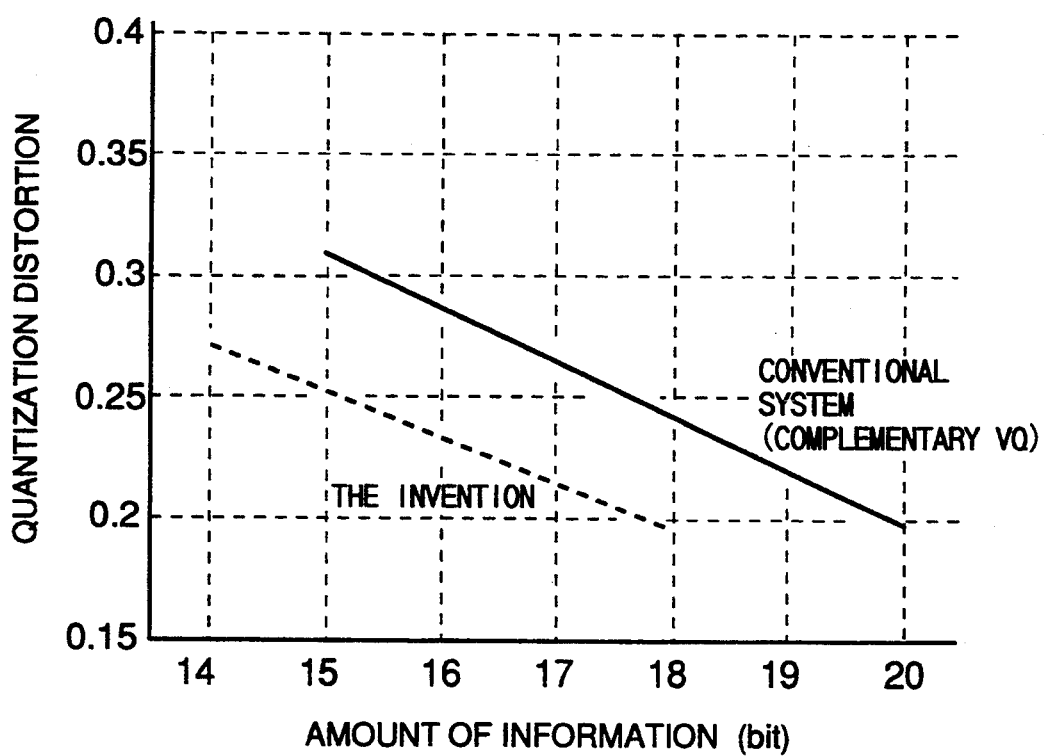
FIG. 9 is a graph for explaining the effect of the present invention.

The advantages of the present invention in this embodiment is shown in FIG. 9. FIG. 9 is a graph showing quantization distortion versus the number of bits required for transmitting the input vector. According to the vector quantizing method of the present invention, it is obvious that quantization distortion in the same amount of information is reduced compared with the conventional method.

According to this embodiment, a part of the indexes of code vectors which need be transmitted in the conventional method to express the input vector by a plurality of code vectors need not be transmitted. Because increase of quantization distortion is not attendant on this case, information compressing efficiency is improved.

When the present invention is applied to speech coding, high quality speech can be transmitted at low bit rates.

Although above description is made upon the case where the present invention is applied to speech information, it is a matter of course that the invention can be applied to different information having an analogous structure.

In the following, an embodiment of a speech analytical synthesizing system according to the present invention is described with reference to the drawings.

Figure 10:
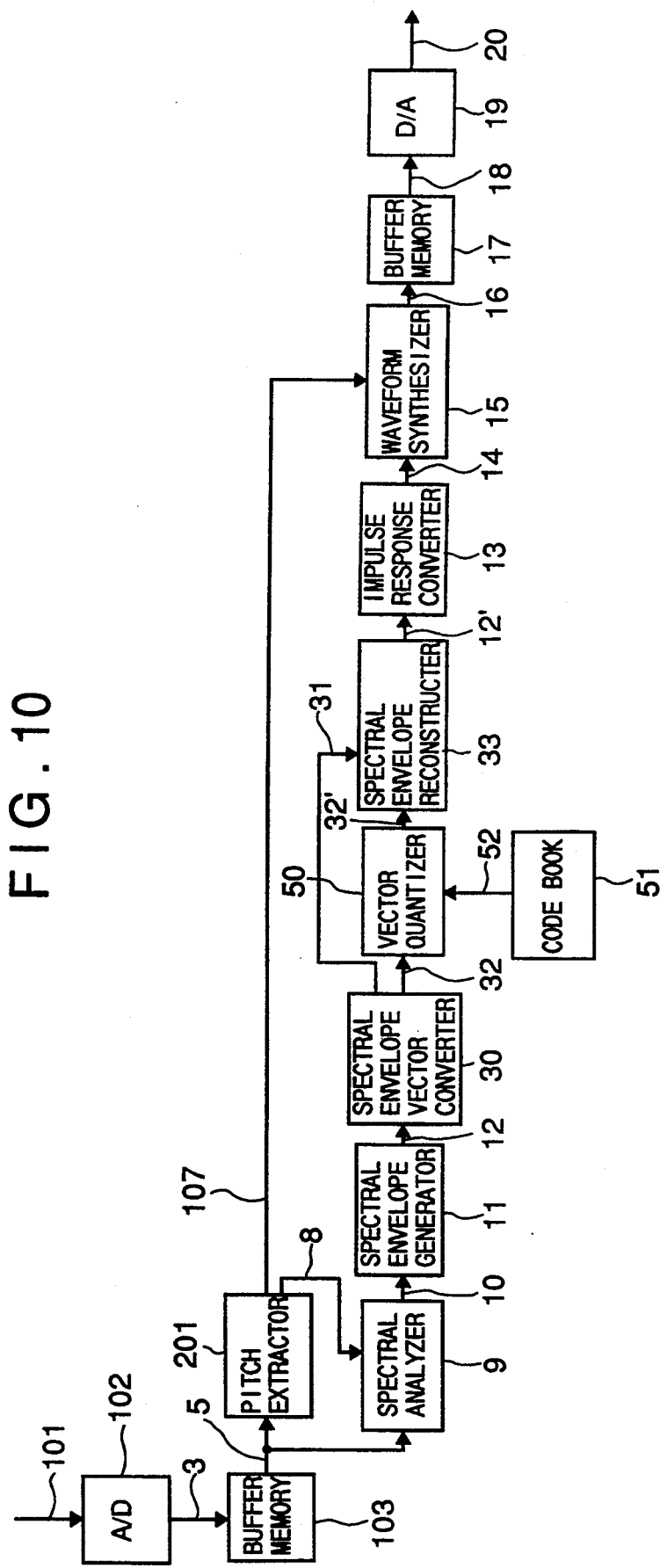
FIG. 10 is a block diagram showing a first embodiment of a speech analysis-synthesis system according to the present invention.

FIG. 10 is a block diagram showing a first embodiment of the speech analytical synthesizing system according to the present invention. In FIG. 10, an analog speech signal 101 is converted into digitized speech data 3 by an analog-to-digital (A/D) converter 102, so that the digitized speech data 3 are inputted into a buffer memory 103 having two pages. This memory is provided for the double purpose of adjusting timing in a subsequent procedure and preventing interruption of the input speech. Speech data 5 of one analysis frame are read from the buffer memory 103 and inputted both into a pitch extractor 201 and into a spectral analyzer 9. In the pitch extractor 201, both a pitch period 107 and a pitch frequency 8 are obtained. The pitch frequency 8 is also inputted into the spectral synthesizer 9 to obtain logarithmic power spectral data sampled at integral multiples of the pitch frequency.

A spectral envelope generator 11 generates logarithmic power spectral envelope (hereinafter merely called "spectral envelope") data 12 from the logarithmic power spectral data 10. The spectral envelope vector converter 30 obtains the average 31 of the spectral envelope data 12 and a spectral envelope vector 32 by normalizing and resampling the spectral envelope data 12.

In a vector quantizer 50, the spectral envelope vector 32 is compared with code vectors 52 read from the codebook 51 to thereby output a quantized spectral envelope vector 32'. The vector quantizer 50 is equivalent to a combination of the vector quantizer 108 and the inverse vector quantizer in FIG. 2.

In a spectral envelope reconstructor 33, the spectral envelope to be outputted as reconstructed spectral envelope data 12' is reconstructed from the quantized spectral envelope vector 32' and the average 31 of the spectral envelope data. In an impulse response converter 13, the reconstructed spectral envelope data 12' are converted into impulse response waveforms 14. In a waveform synthesizer 15, the impulse response waveforms 14 are added to one another while correcting the amplitude thereof and successively shifting the waveforms by the distance of the pitch period 7, to synthesize speech waveforms 16. The speech waveforms 16 pass through an output buffer memory 17 having two pages, to form time-continuous digital signals 18. The digital signals 18 are converted into analog signals by a digital-to-analog (D/A) converter 19 to obtain output speech 20.

In the following, the respective portions are described in detail.

In the A/D converter 102, analog speech signals 101 within a frequency band limited to 4 kHz or less are converted into digitized speech signals 3 at the sampling rate of 8 kHz. Speech data of 30 ms (240 samples) as one analysis frame are read from the buffer memory 103. The period of renewal thereof is 20 ms. These numerical values are the average numerical values generally used in speech analytical synthesis. In the pitch extractor 201, the pitch period 107 is obtained by a known method such as a auto-correlation method, an AMDF method, a cepstrum method, etc. The time resolution of the pitch period is generally a reciprocal (for example, 125 µs in the case of 8 kHz sampling) of the sampling rate. Improvement of the time resolution is attained by interpolation based on quadratic curves. The pitch frequency 8 is calculated as a reciprocal of the pitch period 107.

Figure 11:
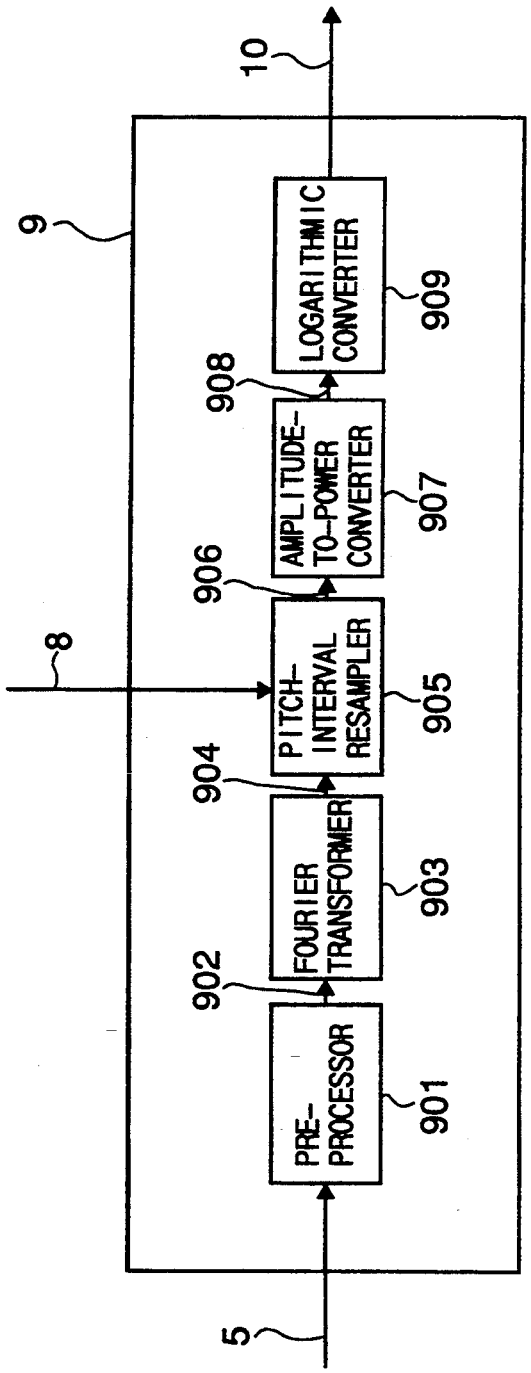
FIG. 11 is a block diagram of the spectrum analyzer.

FIG. 11 is a diagram for explaining the spectral analyzer 9. In a pre-processor 901, hamming windows are applied to speech data 5 of one frame (240 samples) and then 1808 data having the value of zero are added thereto, to produce 2048 data 902 in total. The data 902 are inputted into a Fourier transformer 903 and subjected to fast Fourier transform (FFT). The absolute values of Fourier coefficients express the frequency components, that is, spectra, of the speech data 5. The spectra are considered to be expressed by amplitude and phase (though the spectra may be expressed by complex spectra, they can be transformed into each other). The reason that data having the value of zero are added in the pre-processor 901 is that frequency resolution is improved. In this embodiment, the resolution is about 3.9 Hz. Here, 1024 amplitude data 904 corresponding to the frequencies of 0 to 4 kHz are outputted.

In a pitch-interval resampler 905, amplitude data 906 corresponding to integral multiples of the pitch frequency 8 are resampled from the amplitude data 904 with 0 Hz as a starting point. When, for example, the pitch frequency is 120 Hz, 34 amplitude data 906, in total, corresponding to 0, 120, 240, ..., 3960 Hz are outputted in the error of not larger than a half of the frequency resolution. The reason that amplitude data are resampled at integral multiples of the pitch frequency has been described in detail in the above report, by Nakajima et al., "Power Spectral Envelope (PSE) Speech Analysis-Synthesis System", Acoustical Society of Japan, Vol. 44, No. 11, Sho-63-11/1988.

In an amplitude-to-power converter 907, the resampled amplitude data 906 are squared to form power data 908. In a logarithmic converter 909, the power data 908 are respectively logarithmically converted to output logarithmic power data 10. The logarithmic power data can be regarded as data obtained by resampling the logarithmic power spectra of one-frame's speech data at integral multiples of the pitch frequency. Accordingly, the logarithmic power data 10 are also called "logarithmic power spectral data resampled at integral multiples of the itch frequency".

Figure 12:
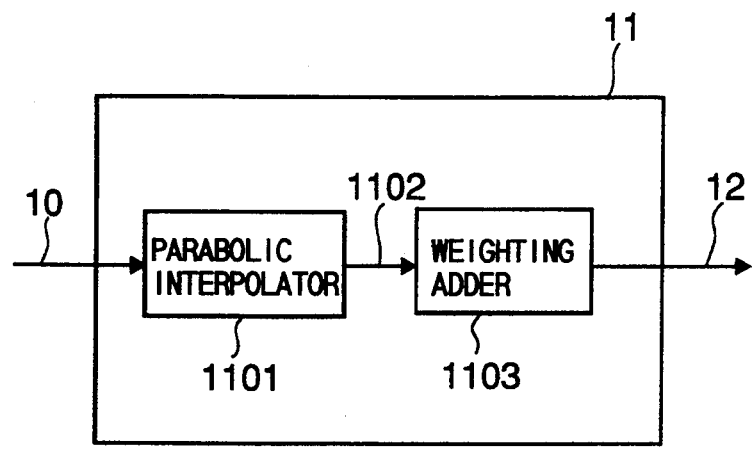
FIG. 12 is a block diagram of the spectral envelope generator.
Figure 13:
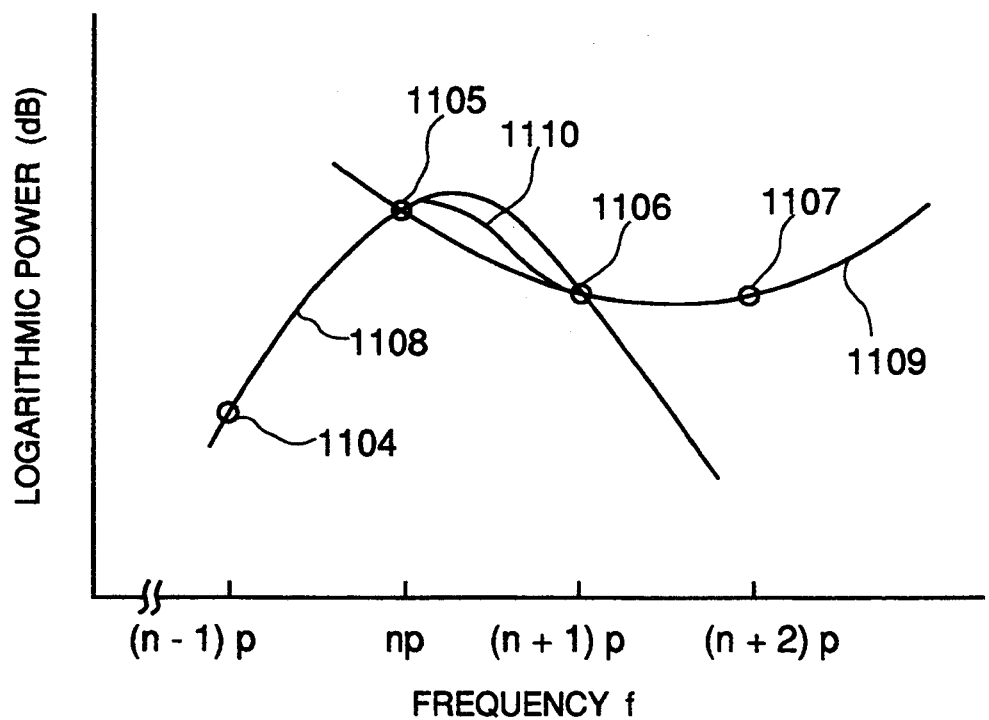
FIG. 13 is a graph for explaining the principle of spectral envelope generation.

FIG. 12 shows the configuration of the spectral envelope generator 11. The spectral envelope generator 11 is composed of a parabolic interpolator 1101 and a weighting adder 1103. In the parabolic interpolator 1101, a parabola passing three continuous data of the logarithmic power data 10 is determined. FIG. 13 is a graph for explaining the determination of such a parabola. A parabola 1108 passing three logarithmic power data 1104, 1105 and 1106 is determined. The parabola 1108 is expressed by the numerical expression (8):

$$y_n(f) = a_n f^2 + b_n f + c_n \tag{8}$$

in which f represents the frequency. A parabola 1109 passing three logarithmic power data 1105, 1106 and 1107 is determined in the same manner as described above. The parabola 1109 is expressed by the numerical expression (9):

$$y_{n+1}(f) = a_{n+1} f^2 + b_{n+1} f + c_{n+1} \tag{9}$$

In the weighting adder 1003, the value y(f) of logarithmic power between points np and (n+1)p (p represents the pitch frequency) on the frequency axis is interpolated as represented by the numerical expression (10) by using the parabolas 1108 and 1109 (generically represented by the reference numeral 1102 in FIG. 12) determined as described above.

$$y(f) = w(f) \cdot y_n(f) + \{1 - w(f)\} \cdot y_{n+1}(f) \tag{10}$$

Figure 14:
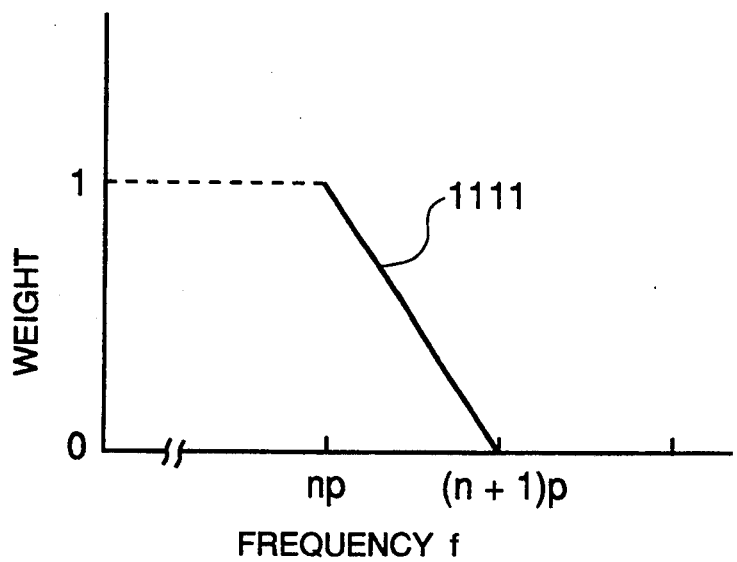
FIG. 14 is a graph showing an example of a weighting function.

In the expression (10), w(f) is a weighting function as represented by the reference numeral 1111 in FIG. 14. That is, the interpolated value is the weighted average of the two parabolas. The result of interpolation is represented by the reference numeral 1110 in FIG. 13. As to the space between the frequency 0 and the frequency p, a parabola passing the logarithmic power data of −p, 0 and p and a parabola passing the logarithmic power data of 0, p and 2p are calculated on the assumption that the logarithmic power value of the frequency p exists in the frequency −p because the original logarithmic power spectra are symmetric with respect to the frequency 0. Interpolation into the space between the frequency 0 and the frequency p is performed by using the two parabolas. The aforementioned procedure is applied to all of the logarithmic power data 10, thus to generate spectral envelope data 12. When Fourier transform is applied to 2048 points, 1024 spectral envelope data are obtained.

On the other hand, Nakajima et al. define the spectral envelope by the finite-term cosine series numerical expression (11):

$$Y(\lambda) = A_0 + A_1 \cos\lambda + A_2 \cos(2\lambda) + \ldots + A_m \cos(m\lambda) \quad (11)$$

in which $m$ represents the number of terms, and $\lambda$ represents the angular frequency corresponding to the sampling frequency $2\pi$. The coefficients $A$ are determined to minimize the square error between the logarithmic power spectral data 10 sampled at the pitch frequency and $Y(\lambda)$ obtained by the numerical expression (11). The number of terms $m$ is about 25. The detail thereof has been described in the aforementioned report, by Nakajima et al., "Power Spectral Envelope (PSE) Speech Analysis-Synthesis System", Acoustical Society of Japan, Vol. 44, No. 11, Sho-63-11/1988. In the spectral envelope defined by cosine series, continuousness in differentiation of $n$ order with respect to the frequency is obtained but excessive beating may occurs in the form thereof. On the contrary, in the spectral envelope obtained by the method of the present invention, continuousness in differentiation of $n$ order is not secured but the form thereof is smooth and free from excessive beating.

Figure 15:
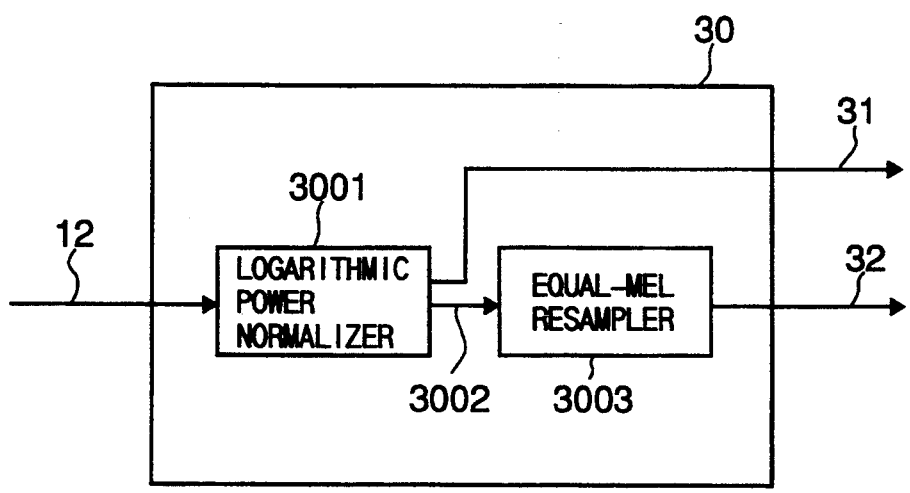
FIG. 15 is a block diagram of the spectral envelope vector converter.

In the following, the spectral envelope vector converter 30 is described with reference to FIG. 15. The average 31 of spectral envelope data 12 is calculated in a logarithmic power normalizer 3001, so that normalized spectral envelope data 3002 are obtained by subtracting the average 31 from the respective spectral envelope data. In an equal-mel resampler 3003, a predetermined number (which coincides with the number of dimensions in the vector) of data are resampled from the normalized spectral envelope data 3002 and outputted as a spectral envelope vector 32. In the resampling method, data to be picked up are determined to be arranged at equal intervals on mel-scale. Specifically, after a table having a predetermined number of frequency values to be arranged at equal intervals on mel-scale is produced in advance, normalized spectral envelope data 3002 are re-sampled by reference to the table.

Direct use of the logarithmic power spectral data 10 sampled at intervals of the pitch frequency may be considered as an example of vector quantization of frequency-region parameters. Because the number of data, however, depends on the pitch frequency and varies according to the frame, matching with vector quantization using fixed-dimensional vectors is generally poor. Therefore, vectors as subjects of vector quantization are produced by resampling the spectral envelope data in the present invention.

Although the degree of approximation of the spectral envelope is improved more significantly as the number of vector dimensions (the number of resampled data) increases, the number of vector dimensions cannot be increased so much because both the amount of operation in distance calculation for comparison with code vectors and the capacity of storage of the code vectors increase. Accordingly, it is important to resample spectral envelope data to make deterioration of tone quality as small as possible in spite of a small number of samples. In this embodiment, spectral envelope data are resampled to be arranged at equal intervals on mel-scale. That is, spectral envelope data are resampled so that the low frequency region becomes more dense and the high frequency region becomes less dense. The number of samples (the number of vector dimensions) in resampling is about 25. Synthesized speech less in deterioration of acoustic quality in spite of a small number of vector dimensions can be reconstructed by resampling at equal intervals on mel-scale.

Distances between the spectral envelope vector 32 and respective code vectors 52 stored in the codebook 51 are calculated in the vector quantizer 50, so that the value of a code vector smallest in distance is outputted as a spectral envelope vector 32'. Although above description is made upon the case where a general vector quantizing method is used, other methods such as fuzzy vector quantization and complementary vector quantization which have been proposed by the inventors of the present invention may be used in the vector quantizer. These methods have been disclosed in the above U.S. patent application Ser. No. 07/412987. In any case, a spectral envelope vector 32' quantized correspondingly to the spectral envelope vector 32 can be obtained.

Figure 16:
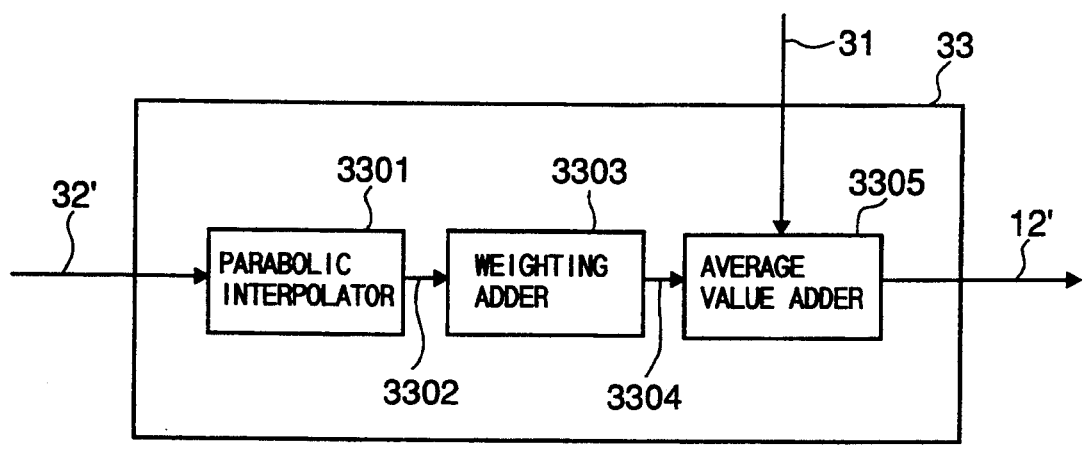
FIG. 16 is a block diagram of the spectral envelope reconstructor.

In the following, the spectral envelope reconstructor 33 is described. FIG. 16 shows the configuration thereof. In the spectral envelope reconstructor 33, spectral envelope data 12' reconstructed from the spectral envelope vector 32' quantized by vector quantization are obtained. When the quantized spectral envelope vector 32' is rearranged on the frequency axis, data are arranged at irregular intervals. The space between the rearranged data is obtained by interpolation. Specifically, interpolation into the space between two data is performed in the same manner as in the spectral envelope generator 11, by weightingly adding two parabolas 3302 passing the two data in the weighting adder 3303 after applying parabolic interpolation to three adjacent data in the parabolic interpolator 3301. As a result, 1024 normalized spectral envelope interpolation data 3304 corresponding to the frequency values of 0 Hz to 4 kHz are obtained. In an average value adder 3305, reconstructed spectral envelope data 12' are obtained by adding the average 31 of the spectral envelope data subtracted at the time of normalization to the interpolation data 3304.

The method of defining the spectral envelope by applying cosine series (proposed by Nakajima et al.) cannot be applied to data arranged at irregular intervals. This is because restriction on cosine series values is effective for points having resampled values but the values of other points may vary extremely. On the contrary, parabolic interpolation in the present invention has an advantage that data can be interpolated smoothly even if the data are arranged at irregular intervals.

Figure 17:
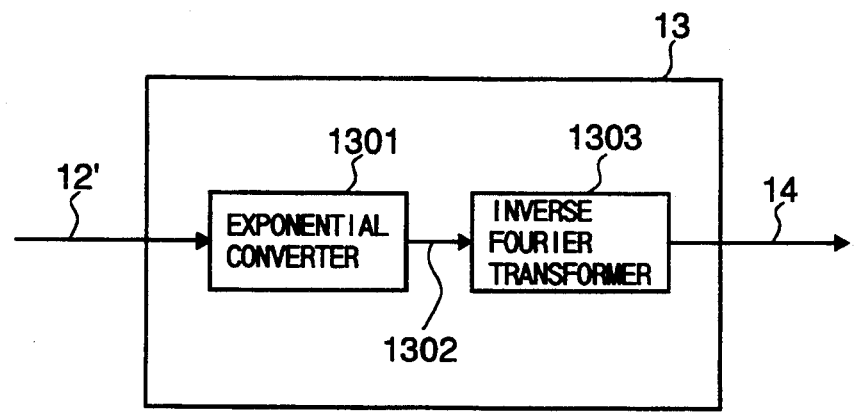
FIG. 17 is a block diagram of the impulse response converter.
Figure 18:
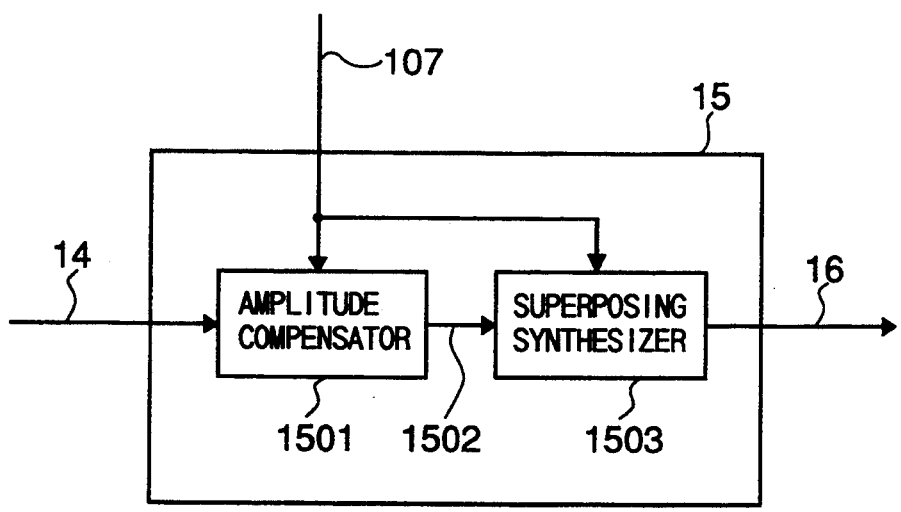
FIG. 18 is a block diagram of the waveform synthesizer.

The reconstructed spectral envelope data 12' are converted into impulse response waveforms 14 in the impulse response converter 13 shown in FIG. 17. The 1024 reconstructed spectral envelope data 12' are converted from the dimension of logarithmic power to the dimension of absolute value amplitude to obtain zero-phased spectra 1302. Because spectra are symmetric with respect to the frequency 0 Hz, 2048 data are obtained by adding inverted frequency data. Zero-phased impulse response waveforms 14 are obtained by applying inverse fast Fourier transform (IFFT) to the 2048 data in an inverse Fourier transformer 1303. The phase condition of the impulse response waveforms is not limited to zero-phase.

The impulse response waveforms 14 are inputted into the waveform synthesizer 15 to synthesize reconstructed speech waveforms of one frame cycle (20 ms). First, the number of impulse response waveforms to be contained in one frame cycle is calculated in an amplitude compensator 1501 by using the pitch period 7. Then, impulse response waveforms 1502 having the amplitude corrected by multiplying the amplitude by a coefficient proportional to the number of impulse response waveforms thus calculated are obtained. This purpose is to make power in the frame of synthesized speech coincide with power of the original speech. Then, the impulse response waveforms 1502 are superposed on one another in a superposing synthesizer 1503 while successively shifted by the distance of the pitch cycle 7 to thereby produce speech waveforms 16 of one frame.

The speech waveforms 16 of one frame are inputted into the buffer memory 17 having two pages, so that time-continuous digital speech signals 18 are converted into analog speech signals 20 in the digital-to-analog (D/A) converter 19.

According to this embodiment, good quality synthesized speech can be obtained though information contained in the spectral envelope is compressed by vector quantization.

Figure 19:
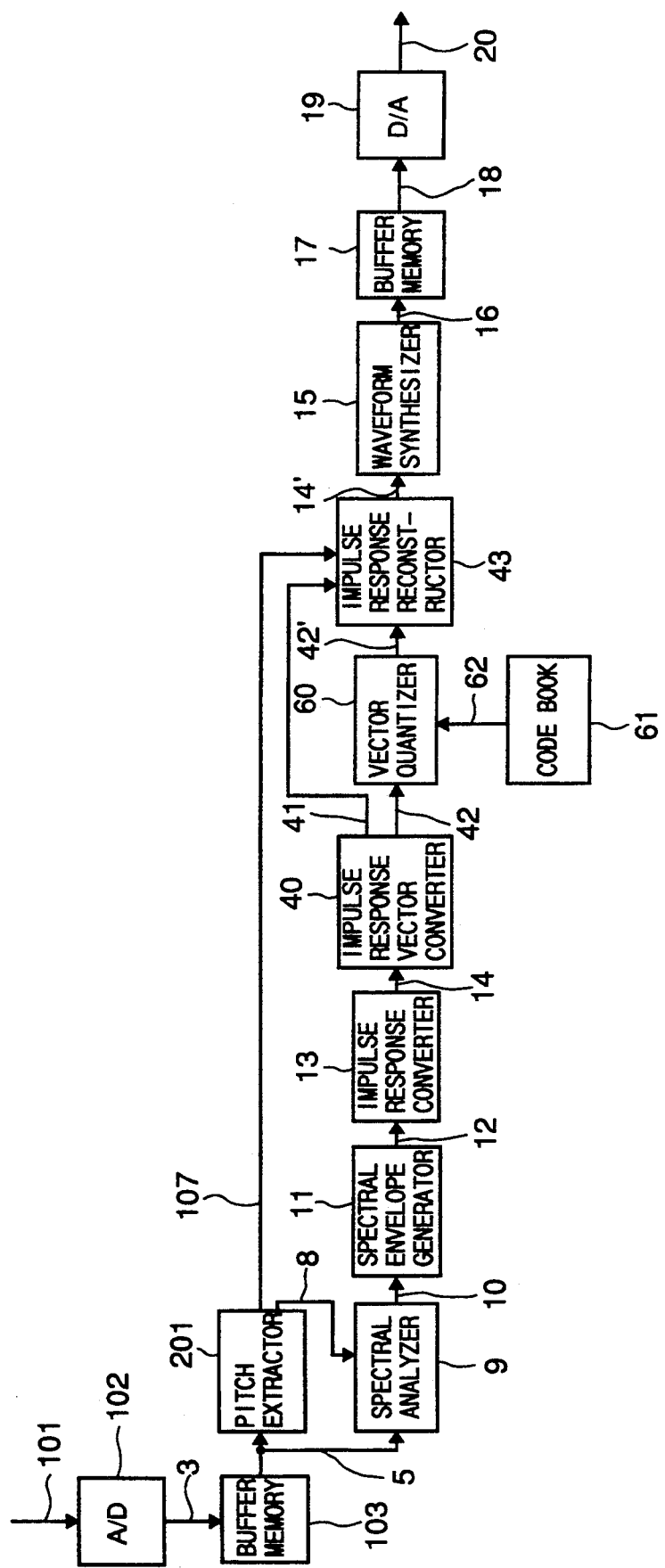
FIG. 19 is a block diagram showing a second embodiment of the speech analysis synthesising system according to the present invention.

In the following, a second embodiment of the speech analysis-synthesis system according to the present invention will be described. FIG. 19 is a block diagram showing the second embodiment. The second embodiment is different from the first embodiment in that vector quantization of the spectral envelope is replaced by vector quantization of impulse response waveforms. Because the other portions are substantially the same as those in the first embodiment, the vector quantizer for impulse response waveforms will be described hereunder in detail.

In the impulse response converter 13, spectral envelope data 12 obtained by the spectral envelope generator 11 are converted into zero-phased impulse response waveforms 14. The impulse response waveforms 14 are converted into a vector as a subject of vector quantization in the impulse response vector converter 40.

Figure 20:
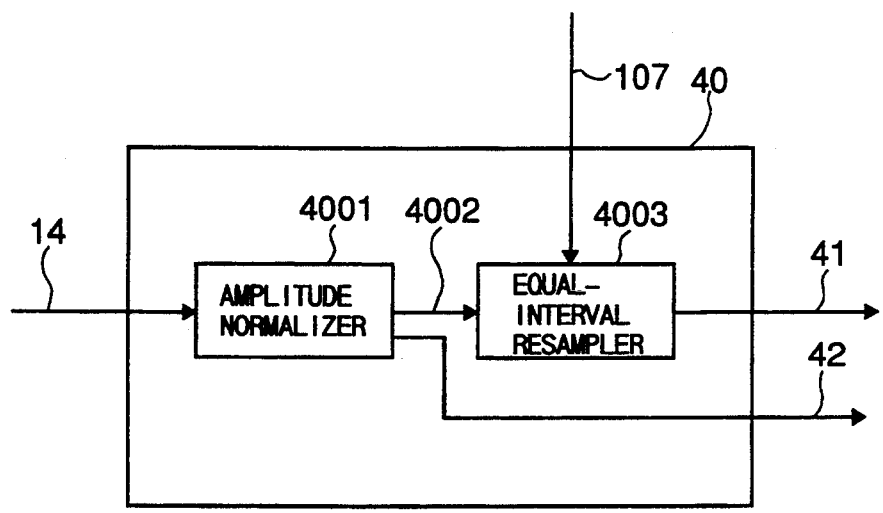
FIG. 20 is a block diagram of the impulse response vector converter.

FIG. 20 shows the configuration of the impulse response vector converter 40. In the impulse response vector converter 40, zero-phased impulse response waveforms (a row of amplitude value data with predetermined time resolution, for example, intervals of 125 µs in this embodiment) 14 are inputted to obtain an impulse response vector 42 for vector quantization. Specifically, because zero-phased impulse response waveforms are symmetric with respect to the time 0, data at the time 0 and above are picked up in an amplitude normalizer 4001. Then, because the amplitude value of the data at the time 0 is maximum, normalized-amplitude impulse response data 4002 are obtained by dividing the amplitude values of the other data by the maximal value. The amplitude value of the data at the time 0 is outputted as the maximal amplitude value 41.

Further, in an equal-interval resampler 4003, the normalized-amplitude impulse response waveform data 4002 in the number corresponding to the number of vector dimensions are resampled in order of starting from the sample at the time 0 so as to be arranged at equal intervals of a distance, to thereby obtain an impulse response vector 42. A distance determined as a function of the pitch period 7 in advance is selected as the distance for resampling. When, for example, the pitch period is not longer than twice the number of vector dimensions, every sample is picked up. When, for example, the pitch period is longer, every second sample is picked up. An impulse response vector keeping important acoustic characteristic can be obtained by the aforementioned method.

Distances between the impulse response vector and respective code vectors stored in the codebook 61 are calculated in the vector quantizer 60, so that the value of a code vector smallest in distance is outputted as a quantized impulse response vector 42'. The structure and function of the vector quantizer 60 and the codebook 61 are the same as those of the vector quantizer 50 and the codebook 51 in the first embodiment. The code vectors 62 are exclusively used for impulse response and are different from the code vectors 52 in the first embodiment.

In the impulse response reconstructor 43, the original impulse response waveform data are reconstructed from the impulse response vector 42' quantized by vector quantization. Because information related to the cut portions as exceeding the number of vector dimensions has been lost from the quantized impulse response data 42', the lost information is extrapolated as follows. The impulse response is considered as an output in the case where a single impulse is inputted into a system having the characteristic of a speech path as a transmission function. Accordingly, approximation of the speech path characteristic can be estimated from a part of the impulse response waveform having a length to some degree. Therefore, a known linear prediction technique is employed as a speech path characteristic estimating method. That is, a linear predictive coefficient (LPC) is obtained by linear predictive analysis while regarding the quantized impulse response vector 42' as a waveform. A waveform being so exact as to exceed the number of vector dimensions is predicted by using the coefficient and extrapolated. An extrapolated waveform having the vocal tract characteristic estimated from the quantized impulse response vector 42' can be obtained by the aforementioned method.

Figure 21:
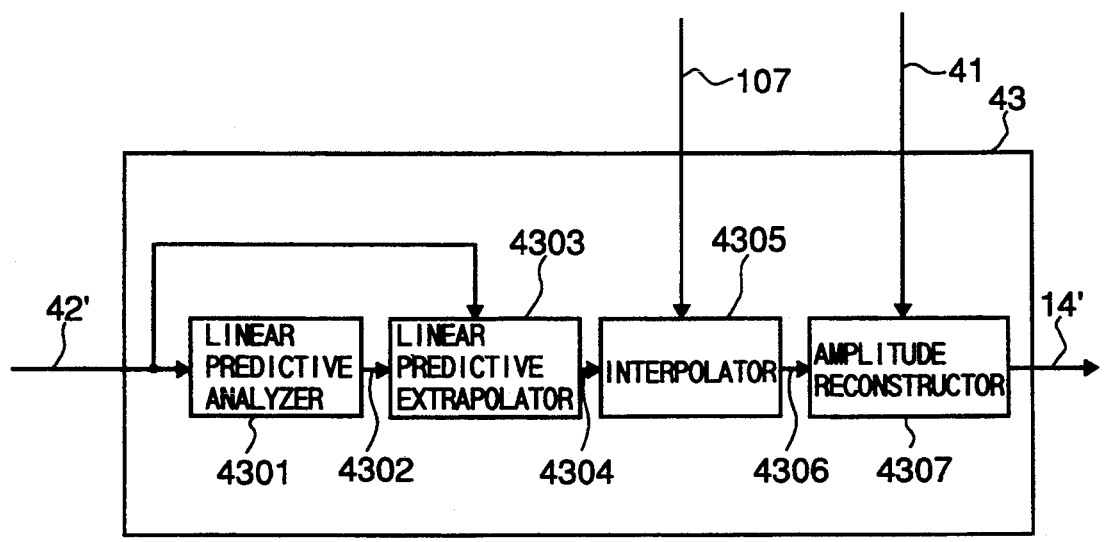
FIG. 21 is a block diagram of the impulse response reconstructor.

FIG. 21 shows the configuration of the impulse response reconstructor 43. In a linear predictive analyzer 4301, a linear predictive coefficient 4302 is obtained by linear predictive analysis of the quantized impulse response vector 42'. In a linear predictive extrapolator 4303, data as exceeding the number of vector dimensions in the quantized impulse response vector 42' are obtained by linear prediction by using the predictive coefficient 4302. Suitable attenuation windows such as half-cycle raised cosine windows are applied to the extrapolation portions so that the impulse response is attenuated by a suitable length. Extrapolation impulse response data 4304 are obtained by the aforementioned method.

In an interpolator 4305, intermediate values are interpolated by applying quadratic curves or the like to obtain extrapolation impulse data 4306 having predetermined time resolution in the case where data are sampled at intervals of every two samples in the equal-interval resampler 4003 correspondingly to the value of the pitch period 7.

In an amplitude reconstructor 4307, amplitude values are reconstructed by multiplying the extrapolation impulse response data 4306 by the maximal amplitude value 41 used for amplitude normalization. Further, reconstructed zero-phased impulse response waveforms 14' are obtained by generating waveforms symmetric with respect to the time 0. The procedure after the step of the waveform synthesizer is the same as that in the first embodiment. Detailed description of the procedure will be omitted.

According to this embodiment, good quality synthesized speech can be obtained though information contained in the impulse response waveforms is compressed by vector quantization.

In the following, a speech coding/decoding system using the speech analytical synthesizing system of the first embodiment to transmit speech at low bit rates is described as a third embodiment.

Figure 22:
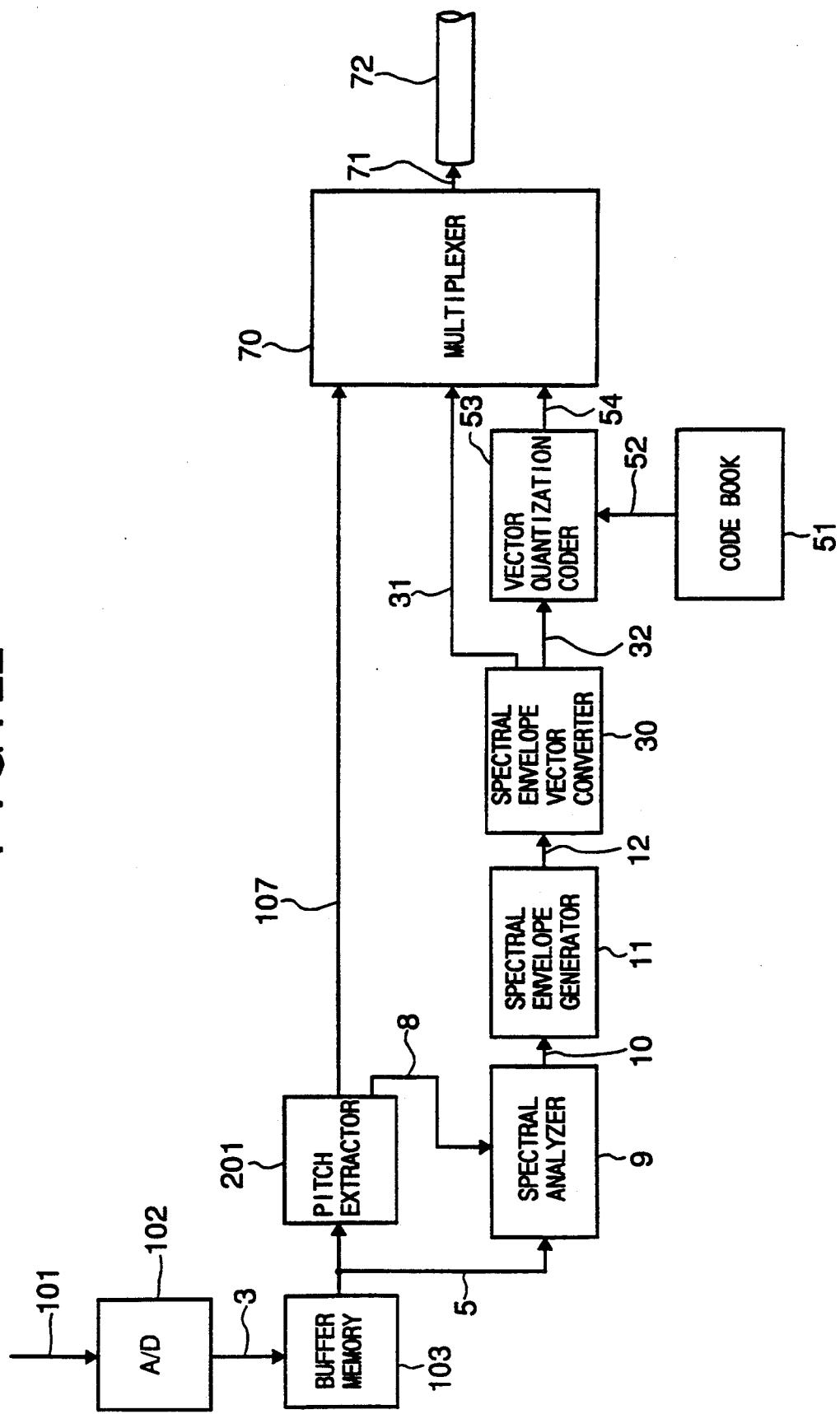
FIG. 22 is a block diagram showing an embodiment of a transmitter using the speech coding/decoding technique according to the present invention.
Figure 23:
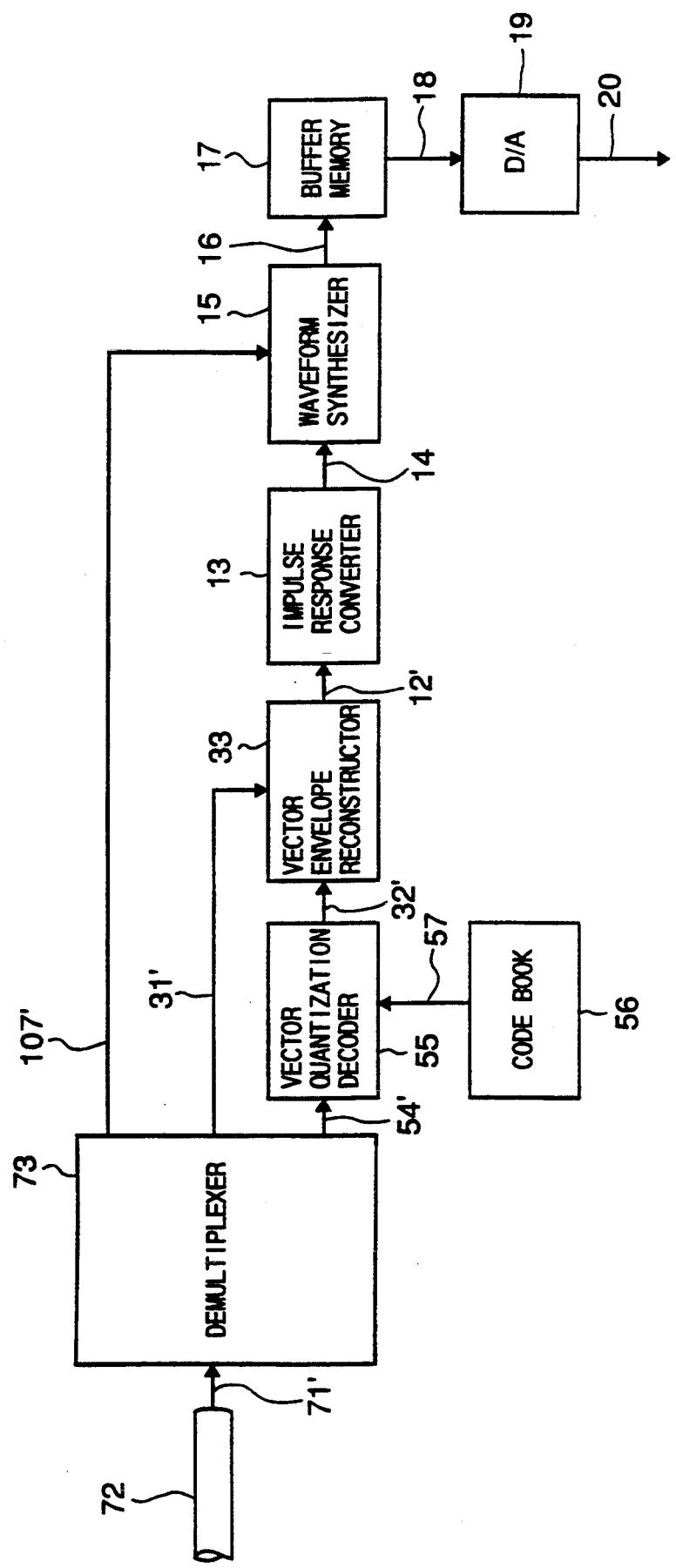
FIG. 23 is a block diagram showing an embodiment of a receiver using the speech coding/decoding technique according to the present invention.

FIGS. 22 and 23 are block diagrams of the speech coding/decoding system as the third embodiment. In the drawings, a one-directional communication path on the transmitter side (FIG. 22) and the receiver side (FIG. 23) forming a pair is shown but a reverse-directional communication path is not shown for the reason of complication of illustration. Vector quantization as a quantization process is separated into a process to the outputting of indexes and the like and a process for reconstructing vectors from the indexes and the like. For the sake of convenience, the former is called "vector quantization coding" and the latter is called "vector quantization decoding".

In FIG. 22, the procedure from the step of inputting analog speech signals 1 to the step of converting the signals into a spectral envelope vector 32 in the spectral envelope vector converter 30 is the same as that in the first embodiment. In the vector quantization coder 53, distances between the spectral envelope vector 32 and respective code vectors 52 stored in the codebook 51 are calculated, so that the index 54 of a code vector smallest in distance is outputted. In fuzzy vector quantization or in complementary vector quantization, information attendant to the index of the code vector is also outputted.

In a multiplexer 70, the pitch period 7, the average 31 of the spectral envelope data and the index 54 (and attendant information) of the code vector are quantized to obtain a predetermined bit rate and are transmitted, as a multiplexed data 71 transformed into a predetermined form, to a transmission channel 72.

In FIG. 23, the data 71' received from the transmission channel 72 is separated into the pitch cycle 7', the average 31' of the spectral envelope data and the index (and attendant information) 54' of the code vector in the demultiplexer 73. The meaning of "'" is that bit error may be produced on quantization in the multiplexer 70 and on the transmission channel to make the separated values different from the input values to the multiplexer 70.

In a vector quantization decoder 55, a quantized spectral envelope vector 32' is outputted by inputting the index (and attendant information) 54' of the transmitted code vector and then reading the code vector 57 corresponding to the index 54' from the codebook 56. It is a matter of course that the codebook 56 is the same as the codebook 51. The procedure after the step of the spectral envelope reconstructor 33 is the same as that in the first embodiment.

According to the third embodiment, high quality speech can be transmitted at low bit rates. Further, it is obvious that a speech coding/decoding system equivalent to the third embodiment can be formed by using the speech analytical synthesizing system of the second embodiment. It is a matter of course that transmission of the multiplexed data 71 to the transmission channel 72 may be replaced by storage thereof in a storage device such as a semiconductor memory, a magnetic disc, etc., to provide a speech accumulation/reproduction method for synthesizing speech by reading the multiplexed data from the storage device.

According to the present invention, vector quantization is performed by sampling logarithmic power spectral envelope data being important on acoustic quality to arrange the data at equal intervals on mel-scale. Accordingly, good synthesized speech can be obtained even if the amount of information is small. As another effect of the invention, vector quantization is performed by sampling acoustically important portions from impulse response waveforms, to reconstruct the original impulse response waveforms by extrapolation to keep the speech path characteristic. Accordingly, good synthesized speech can be obtained even if the amount of information is small. As a further effect of the invention, synthesized speech less in the feeling of noise can be obtained by defining a spectral envelope free from excessive beating.

When the invention is applied to speech transmission, high quality speech can be transmitted at low bit rates. Further, low bit rate speech accumulation and reproduction can be made.

Although description of the invention is made upon the case where the invention is applied to speech, it is a matter of course that the invention can be applied to other information having an analogous structure.

What is claimed is:

1. A speech analysis-synthesis system for synthesizing by using a small amount of information, the system comprising:
    a separation means for separating a speech signal into short-time speech data;
    a pitch extraction means for applying pitch analysis to said short-time speech data to output a pitch;
    a spectral analysis means for applying spectral analysis to said short-time speech data to output a row of logarithmic power spectral data;
    a spectral envelope generation means for generating a spectral envelope from said row of logarithmic power spectral data;
    a spectral envelope vector conversion means for normalizing logarithmic power values of said spectral envelope to extract a predetermined number of logarithmic power values as spectral envelope vectors;
    a vector quantization means for quantizing said spectral envelope vectors by comparison with a plurality of vectors prepared in advance;
    a spectral envelope reconstruction means for reconstructing said spectral envelope by interpolation of said quantized spectral envelope vectors;
    an impulse response conversion means for converting said reconstructed spectral envelope into an impulse response waveform; and a waveform synthesis means for synthesizing a speech waveform by superposition at intervals of said pitch while compensating an amplitude of said impulse response waveform.

2. A speech analysis-synthesis system according to claim 1, wherein said spectral envelope vector conversion means includes means for extracting a predetermined number of logarithmic power values at intervals so that a low-frequency portion becomes more dense while a high-frequency portion becomes less dense, from spectral envelope samples after normalization of logarithmic power values.

3. A speech analysis-synthesis system according to claim 1, wherein said spectral envelope reconstruction means includes means for performing parabolic interpolation on each adjacent three samples of said spectral envelope vectors quantized by said vector quantization means, performing interpolation into space between two samples by adding weighted adjacent two parabolas, and reconstructing said logarithmic power values by an operation reverse to normalization of said logarithmic power values to thereby reconstruct said spectral envelope.

4. A speech analysis-synthesis system for synthesizing by using a small amount of information, the system comprising:
a separation means for separating a speech signal into short-time speech data;
a pitch extraction means for performing pitch analysis on said short-time speech data to thereby output a pitch;
a spectral analysis means for performing spectral analysis on said short-time speech data to thereby output a row of logarithmic power spectral data;
a spectral envelope generation means for generating a spectral envelope from said row of logarithmic power spectral data;
an impulse response conversion means for converting said spectral envelope into an impulse response waveform;
an impulse response vector conversion means for normalizing an amplitude of said impulse response waveform to extract a predetermined number of amplitude data as impulse response vectors;
a vector quantization means for quantizing said impulse response vectors by comparison with a plurality of vectors prepared in advance;
an impulse response reconstruction means for reconstructing said impulse response waveform by interpolation or extrapolation of said quantized impulse response vectors; and
a waveform synthesis means for synthesizing a voice waveform by superposition at intervals of said pitch while compensating the amplitude of said reconstructed impulse response waveform.

5. A speech analysis-synthesis system according to claim 4, wherein said impulse response vector conversion means includes means for extracting the predetermined number of amplitude data from samples of said impulse response waveform after normalization of the amplitude thereof, according to an extracting manner determined on the basis of the value of said pitch in advance.

6. A speech analysis-synthesis system according to claim 4, wherein said impulse response reconstruction means includes means for performing linear predictive analysis on said impulse response vectors quantized by said vector quantization means while regarding said impulse response vectors as waveforms, extrapolating said quantized impulse response vectors by using a linear predictive coefficient, and reconstructing said amplitude by an operation reverse to normalization of said amplitude to thereby reconstruct said impulse response waveform.

7. A speech analysis-synthesis system according to claim 4, wherein said spectral envelope generation means includes means for performing parabolic interpolation to each adjacent three data of said logarithmic power spectral data row, and performing interpolation into space between two data by adding weighted adjacent two parabolas to thereby generate said spectral envelope.

8. A speech analysis-synthesis system according to claim 4, wherein said vector quantization means includes means for using fuzzy vector quantization or complementary vector quantization in which spectral envelope vectors or said impulse response vectors are quantized by a linear combination of at least two vectors in a plurality of vectors prepared in advance.

9. A speech coding/decoding system using a speech analysis-synthesis system according to claim 8, wherein said vector quantization means is separated into a vector quantization coding means for receiving said spectral envelope vectors or said impulse response vectors and for outputting indexes and attendant information corresponding to said spectral envelope vectors or said impulse response vectors, and a vector quantization decoding means for decoding the quantized values of said spectral envelope vectors or said impulse response vectors by using said plurality of vectors prepared in advance on the basis of said indexes and attendant information, and further wherein means from said separation means to said vector quantization coding means are provided in a transmitter side and means from said vector quantization decoding means to said speech waveform synthesis means are provided in a receiver side.

* * * * *